United States Patent
Yamamoto et al.

(10) Patent No.: US 9,478,763 B2
(45) Date of Patent: Oct. 25, 2016

(54) LIGHT EMITTING ELEMENT, LIGHT EMITTING DEVICE, DISPLAY APPARATUS, AND ELECTRONIC EQUIPMENT HAVING A LIGHT EMITTING LAYER WITH HOST AND ASSIST DOPANT MATERIALS WITH DIFFERENT ELECTRON AND HOLE TRANSPORTATION PROPERTIES

(71) Applicant: SEIKO EPSON CORPORATION, Tokyo (JP)

(72) Inventors: Hidetoshi Yamamoto, Suwa (JP); Akio Fukase, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/645,849

(22) Filed: Mar. 12, 2015

(65) Prior Publication Data

US 2015/0287951 A1    Oct. 8, 2015

(30) Foreign Application Priority Data

Apr. 4, 2014 (JP) .................. 2014-078249
Apr. 4, 2014 (JP) .................. 2014-078250

(51) Int. Cl.
*H01L 29/08* (2006.01)
*H01L 51/50* (2006.01)
*H01L 51/00* (2006.01)
(Continued)

(52) U.S. Cl.
CPC ....... *H01L 51/5024* (2013.01); *H01L 51/5004* (2013.01); *H01L 27/3244* (2013.01); *H01L 51/006* (2013.01); *H01L 51/0054* (2013.01); *H01L 51/0058* (2013.01); *H01L 51/0059* (2013.01); *H01L 51/524* (2013.01); *H01L 2251/5384* (2013.01); *H01L 2251/55* (2013.01); *H01L 2251/552* (2013.01)

(58) Field of Classification Search
CPC ...................................................... H01L 51/50
USPC .......................................................... 257/40
See application file for complete search history.

(56) References Cited

U.S. PATENT DOCUMENTS 8,586,967 B2 * 11/2013 Xue ................. B82Y 10/00
257/40
2005/0112404 A1    5/2005 Hamada et al.
(Continued)

FOREIGN PATENT DOCUMENTS

JP    2005-108726 A    4/2005
JP    2005-108727 A    4/2005
(Continued)

*Primary Examiner* — Caleb Henry
(74) *Attorney, Agent, or Firm* — Oliff PLC

(57) ABSTRACT

A light emitting element has a cathode, an anode, and a light emitting layer (light emitting section) which is provided between the cathode and the anode and emits light by a driving voltage being applied thereto, in which the light emitting section is configured to include a light emitting material, a host material which holds the light emitting material, and an assist dopant material, one of the host material and the assist dopant material is a material with a high electron transportation property, the other is a material with a high hole transportation property, and when a mobility of holes is μh and a motility of electrons is μe in the light emitting layer, a mobility ratio which is represented by μe/μh satisfies a relationship of formula (I) below.

$$0.01 \leq \mu e/\mu h \leq 100 \qquad (I)$$

17 Claims, 5 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 2005/0118456 A1 | 6/2005 | Hamada et al. | |
| 2006/0251923 A1* | 11/2006 | Lin | C07F 15/0046 428/690 |
| 2007/0241667 A1 | 10/2007 | Ohsawa et al. | |
| 2008/0268285 A1* | 10/2008 | Okinaka | H01L 51/0054 428/691 |
| 2009/0066227 A1* | 3/2009 | Okinaka | C09K 11/06 313/504 |
| 2009/0200925 A1* | 8/2009 | Naito | C07D 215/24 313/504 |
| 2009/0302313 A1* | 12/2009 | Choi | H01L 51/5012 257/40 |
| 2010/0084672 A1 | 4/2010 | Ueno et al. | |
| 2010/0176380 A1* | 7/2010 | Jung | C07D 213/30 257/40 |
| 2012/0121933 A1* | 5/2012 | Ma | H01L 51/5036 428/704 |
| 2012/0305898 A1 | 12/2012 | Okamoto | |
| 2013/0069051 A1* | 3/2013 | Tadokoro | H01L 51/5012 257/40 |
| 2013/0105843 A1* | 5/2013 | Lee | C23C 14/24 257/98 |
| 2013/0207082 A1 | 8/2013 | Cho et al. | |
| 2013/0292664 A1* | 11/2013 | Nishimura | C09B 57/00 257/40 |
| 2014/0070194 A1* | 3/2014 | Lai | H01L 51/5016 257/40 |
| 2014/0231787 A1* | 8/2014 | Ishige | H01L 51/5004 257/40 |
| 2015/0108458 A1* | 4/2015 | Shibata | H01L 51/5088 257/40 |
| 2015/0188074 A1* | 7/2015 | Heo | H01L 51/5044 257/40 |
| 2015/0207093 A1* | 7/2015 | Kim | H01L 51/5096 257/40 |

FOREIGN PATENT DOCUMENTS

| | | |
|---|---|---|
| JP | 2008-235874 A | 10/2008 |
| JP | 2009-302537 A | 12/2009 |
| JP | 2011-091449 A | 5/2011 |
| JP | 2011-249436 A | 12/2011 |
| JP | 2013-168649 A | 8/2013 |
| WO | 2008/120714 A1 | 10/2008 |
| WO | 2011/065136 A1 | 6/2011 |

* cited by examiner

LIGHT EMITTING ELEMENT, LIGHT EMITTING DEVICE, DISPLAY APPARATUS, AND ELECTRONIC EQUIPMENT HAVING A LIGHT EMITTING LAYER WITH HOST AND ASSIST DOPANT MATERIALS WITH DIFFERENT ELECTRON AND HOLE TRANSPORTATION PROPERTIES

BACKGROUND

1. Technical Field

The present invention relates to a light emitting element, a light emitting device, a display apparatus, and electronic equipment.

2. Related Art

An organic electroluminescence element (a so-called organic EL element) is a light emitting element which has a structure which interposes at least one light emitting layer (a luminous organic layer) between an anode and a cathode. In such a light emitting element, by applying an electric field between the cathode and the anode, electrons are injected into the light emitting layer from the cathode side and holes are injected from the anode side. As a result, excitons are generated by the electrons and holes being recombined in the light emitting layer, that is, by the carriers being recombined. When the excitons return to a ground state, the energy amount thereof is released as light.

A light emitting layer which releases light in this manner normally includes a light emitting material (a light emitting dopant) and a host material.

Here, the host material is generally included at the highest ratio among the constituent components in the light emitting layer. The host material has a role of supporting a film of the light emitting layer. In addition, the host material has a role of moving excitation energy, which is generated by the recombination of carriers in molecules of the host material when a voltage is applied between electrodes, to a light emitting material and causing the light emitting material to emit light. In contrast, the light emitting material is a compound which has fluorescence or phosphorescence and has a role of substantially emitting light by being excited by receiving excitation energy from the host material.

In an organic EL element with such a configuration, the recombination position of the carriers is determined by a carrier transportation property with which the host material, which is used for the light emitting layer, is provided. In addition, in a case of using a luminescent material as the light emitting material, a large number of host materials such as acene-based compounds such as anthracene and naphthacene exert a great bias on a carrier transportation property of the holes and the electrons. Therefore, the recombination positions of carriers concentrate in the vicinity of the interface of the light emitting layer. As a result, the light emitting material in the vicinity of the interface, that is, only a portion of the light emitting material in the light emitting layer, contributes to the light emission. Thus, there is a problem in that local deterioration is promoted in the light emitting material which is positioned in the vicinity of the interface and deterioration in the brightness of the light emitting layer is accelerated.

With respect to this, in recent years, it has been reported that the efficiency of an organic EL element is increased and the life span thereof is extended by controlling the carrier transportation property in the light emitting layer by forming a light emitting layer which includes an assist dopant material for controlling a carrier transportation property as a constituent material other than the light emitting material and the host material (for example, refer to JP-A-2005-108727).

However, in JP-A-2005-108727, the characteristics of the organic EL element are improved by controlling the relationship between HOMO and LUMO of the host material and the assist dopant material. It is not possible to sufficiently control the carrier transportation property of the holes and electrons simply by controlling the relationship between HOMO and LUMO in this manner. For this reason, it is not possible to set the recombination position of the carriers in the light emitting layer to a favorable position.

SUMMARY

An advantage of some aspects of the invention is to provide a light emitting element which has excellent light emitting characteristics and a life span characteristic of maintaining the light emitting characteristics over a long period. In addition, an advantage of some aspects of the invention to provide a light emitting device, a display apparatus, and electronic equipment which are provided with the light emitting element and have excellent reliability.

The advantages are achieved by the invention described below.

According to an aspect of the invention, there is provided a light emitting element including a cathode, an anode, and a light emitting layer which is provided between the cathode and the anode and emits light by a driving voltage being applied thereto, in which the light emitting layer is configured to include a light emitting material, a host material which holds the light emitting material, and an assist dopant material, one of the host material and the assist dopant material is a material with a high electron transportation property, the other is a material with a high hole transportation property, and when a mobility of holes is $\mu h$ and a motility of electrons is $\mu e$ in the light emitting layer, a mobility ratio which is represented by $\mu e/\mu h$ satisfies a relationship of formula (I) below.

$$0.01 \leq \mu e/\mu h \leq 100 \tag{I}$$

Due to this, it is possible to obtain the light emitting element which has excellent light emitting characteristics and a life span characteristic of maintaining the light emitting characteristics over a long period.

In the light emitting element of the aspect of the invention, it is preferable that the content of the assist dopant material is 20 wt % or more to 70 wt % or less in the light emitting layer.

By setting the content of the assist dopant material within this range, it is possible to easily set the size of the value $\mu e/\mu h$ within a range of 0.01 or more to 100 or less.

In the light emitting element of the aspect of the invention, it is preferable that the host material is a material with a high electron transportation property and that the assist dopant material is a material with a high hole transportation property.

In detail, in the light emitting element of the aspect of the invention, it is preferable that relational formula (A) below is satisfied when a HOMO level, a LUMO level, a mobility of holes, and a mobility of electrons in the host material are respectively $HOMO_{Host}$, $LUMO_{Host}$, $\mu h_{Host}$, and $\mu e_{Host}$, and a HOMO level, a LUMO level, a mobility of holes, and a mobility of electrons in the assist dopant material are respectively $HOMO_{Assist}$, $LUMO_{Assist}$, $\mu h_{Assist}$, and $\mu e_{Assist}$.

$HOMO_{Assist}+0.2\ eV<HOMO_{Host}$ $LUMO_{Host}>LUMO_{Assist}+0.2\ eV$ $\mu h_{Host}<\mu h_{Assist}$ $\mu e_{Host}>\mu e_{Assist}$     (A)

Due to this, it is possible to reliably set the size of the value μe/μh within a range of 0.01 or more to 100 or less. As a result, it is possible to reliably obtain a light emitting element which has excellent light emitting characteristics and a life span characteristic of maintaining the light emitting characteristics over a long period.

In the light emitting element of the aspect of the invention, it is preferable that the host material is an acene-based compound. Since the acene-based compound is a host material with a high electron transportation property, the acene-based compound is favorably used as a host material of a light emitting layer where it is necessary to smoothly supply electrons to the anode side.

In the light emitting element of the aspect of the invention, it is preferable that the assist dopant material is an amine-based compound.

Due to this, it is possible to easily set the size of the value μe/μh within a range of 0.01 or more to 100 or less. In addition, it is possible to easily set the size of the value μe/μh so as to satisfy the relational formula (A).

In the light emitting element of the aspect of the invention, it is preferable that the amine-based compound is a compound which is shown by formula (4) below.

[Chem. 2]

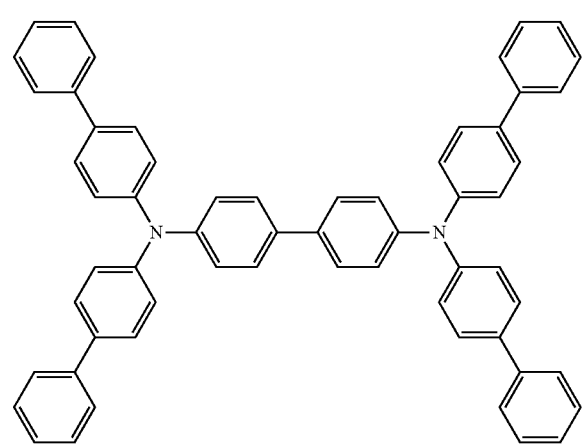

(4)

Due to this, it is possible to more easily set the size of the value μe/μh within a range of 0.01 or more to 100 or less. In addition, it is possible to easily set the size of the value μe/μh so as to satisfy the relational formula (A).

According to another aspect of the invention, there is provided a light emitting device including the light emitting element of the aspect of the invention. Due to this, it is possible to provide a light emitting device for which driving is possible at a comparatively low voltage.

According to still another aspect of the invention, there is provided a display apparatus including the light emitting device of the aspect of the invention. Due to this, it is possible to provide a display apparatus for which driving is possible at a comparatively low voltage.

According to still another aspect of the invention, there is provided electronic equipment including the display apparatus of the aspect of the invention. Due to this, it is possible to provide electronic equipment for which driving is possible at a comparatively low voltage.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, description will be given of favorable embodiments where a light emitting element, a light emitting device, a display apparatus, and electronic equipment according to an aspect of the invention are shown in the attached diagrams.

Firstly, description will be given of a light emitting element (an organic electroluminescence element) 1 of the invention.

First Embodiment

Figure 1:
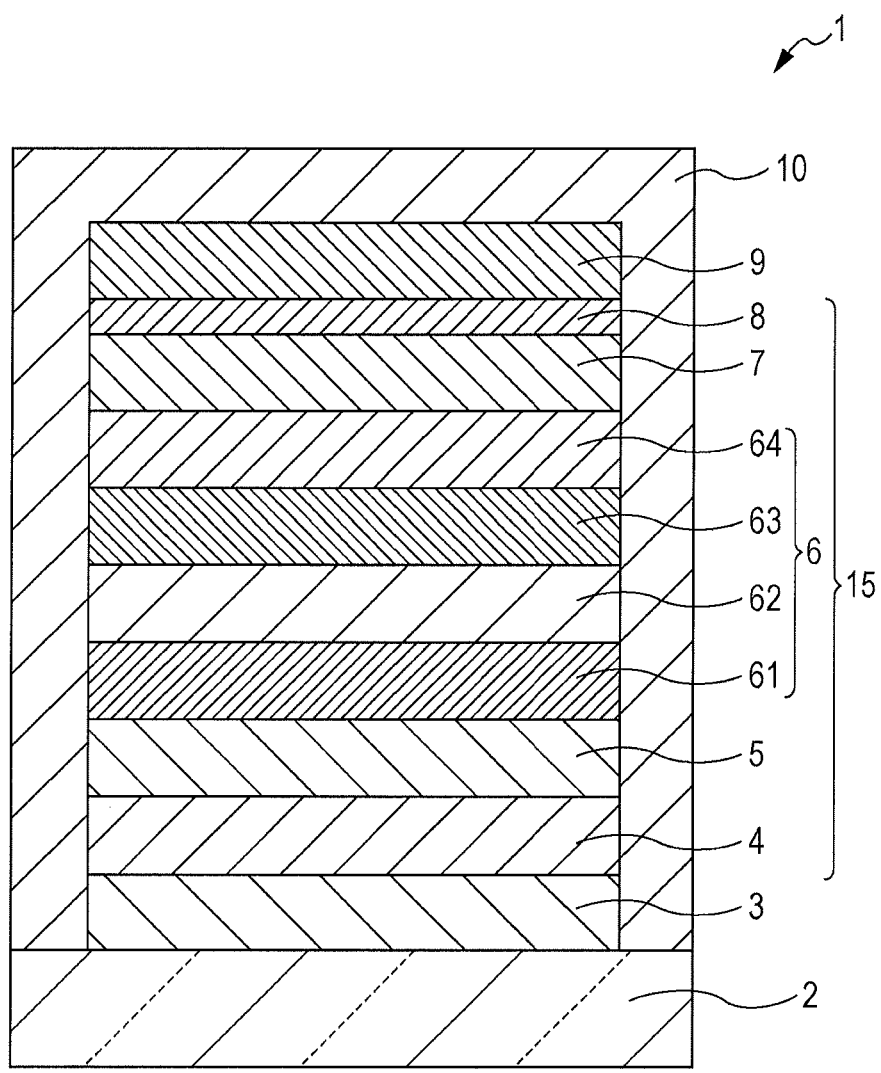
FIG. 1 is a diagram which schematically shows a longitudinal section of a light emitting element according to a first embodiment of the invention.

FIG. 1 is a diagram which schematically shows a longitudinal section of a light emitting element according to a first embodiment of the invention. Here, below, for convenience of description, description will be given by referring to the upper side in FIG. 1 as "above" and the lower side as "below".

A light emitting element (an electroluminescence element) 1 shown in FIG. 1 is an organic light emitting element which emits white light by a plurality of types of organic light emitting materials emitting R (red), G (green), and B (blue) light.

The light emitting element 1 is formed by an anode 3, a hole injection layer 4, a hole transportation layer 5, a light emitting section 6 formed of a plurality of light emitting layers, an electron transportation layer 7, an electron injection layer 8, and a cathode 9 being laminated in this order. In addition, the light emitting section 6 is a laminated body (a laminated body 15) where a red light emitting layer (a first light emitting layer) 61, an intermediate layer 62, a blue light emitting layer (a second light emitting layer) 63, and a green light emitting layer (a third light emitting layer) 64 are laminated in this order from the anode 3 side to the cathode 9 side.

Then, the whole of the light emitting element 1 is provided on a substrate 2 and sealed by a sealing member 10.

In the light emitting element 1, by a voltage (a driving voltage) being applied to the anode 3 and the cathode 9, with respect to the light emitting section 6, electrons are supplied (injected) from the cathode 9 side and holes are supplied (injected) from the anode 3 side. Then, holes and electrons are recombined in each light emitting layer. Excitons are generated by the energy which is released during the recombination. When the excitons return to a ground state, energy (fluorescence or phosphorescence) is released (emitted). Due to this, the light emitting element 1 emits white light.

The substrate 2 supports the anode 3. The light emitting element 1 of the present embodiment has a configuration which extracts light from the substrate 2 side (a bottom emission type). For this reason, the substrate 2 and the anode 3 are each substantially transparent (colorless and transparent, colored and transparent, or semi-transparent).

Examples of constituent materials of the substrate 2 include resin materials such as polyethylene terephthalate, polyethylene naphthalate, polypropylene, cycloolefin polymer, polyamide, polyether sulfone, polymethyl methacrylate, polycarbonate, and polyarylate, glass materials such as quartz glass and soda glass, and the like. As the constituent material of the substrate 2, it is possible to use one type out of these or to combine two types or more.

The average thickness of the substrate 2 is not particularly limited but is preferably approximately 0.1 to 30 mm and more preferably approximately 0.1 to 10 mm.

Here, in a case where the light emitting element 1 has a configuration which extracts light from the opposite side to the substrate 2 (a top emission type), it is possible to use either a transparent substrate or an opaque substrate for the substrate 2.

Examples of opaque substrates include a substrate which is configured by a ceramic material such as alumina, a substrate where an oxide film (an insulating film) is formed on a surface of a metal substrate such as stainless steel, a substrate which is configured by a resin material, and the like.

Below, description will be sequentially given of each section which configures the light emitting element 1. Anode The anode 3 is an electrode which injects holes to the hole transportation layer 5 via the hole injection layer 4 which will be described below. In order to improve the hole injection efficiency, it is preferable to use a material with a large work function and excellent conductivity as the constituent material of the anode 3.

Examples of the constituent material of the anode 3 include oxides such as indium tin oxide (ITO), indium zinc oxide (IZO), $In_2O_3$, $SnO_2$, Sb-containing $SnO_2$, and Al-containing ZnO, Au, Pt, Ag, and Cu, or an alloy which includes these, and the like. As the constituent material of the anode 3, it is possible to use one type out of these or to combine two types or more.

The average thickness of the anode 3 is not particularly limited, but is preferably approximately 10 to 200 nm and more preferably approximately 50 to 150 nm.

Cathode

On the other hand, the cathode 9 is an electrode which injects electrons to the electron transportation layer 7 via the electron injection layer 8 which will be described below. In order to improve the electron injection efficiency, it is preferable to use a material with a small work function as the constituent material of the cathode 9.

Examples of the constituent material of the cathode 9 include Li, Mg, Ca, Sr, La, Ce, Er, Eu, Sc, Y, Yb, Ag, Cu, Al, Cs, and Rb, or an alloy which includes these, and the like. As the constituent material of the cathode 9, it is possible to use one type out of these or to combine two types or more (for example, as a laminated body of a plurality of layers and the like).

In particular, in a case of using an alloy as the constituent material of the cathode 9, an alloy which includes a stable metal element such as Ag, Al, and Cu is preferable. In detail, it is preferable to use an alloy such as MgAg, AlLi, and CuLi. It is possible to improve the electron injection efficiency and stability of the cathode 9 by using the alloy as the constituent material of the cathode 9.

The average thickness of the cathode 9 is not particularly limited but is preferably approximately 100 to 10000 nm and more preferably approximately 100 to 500 nm.

Here, since the light emitting element 1 of the present embodiment is a bottom emission type, there is no particular demand for a light transmitting property in the cathode 9.

Hole Injection Layer

The hole injection layer 4 has a function of improving the injection efficiency of holes which are injected from the anode 3. That is, the hole injection layer 4 has a hole injection property.

In this manner, the hole injection layer 4 includes a material which has a hole injection property (a hole injection material).

The hole injection material is not particularly limited; however, examples thereof include copper phthalocyanine, 4,4',4"-tris(N,N-phenyl-3-methylphenylamino)triphenylamine (m-MTDATA), N,N'-bis-(4-diphenylamino-phenyl)-N, N'-diphenyl-biphenyl-4-4'-diamine shown in formula (1) below, and the like.

[Chem. 3]

(1)

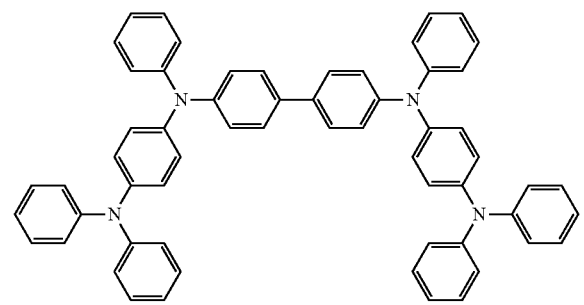

Among these, from the viewpoint of the hole injection property being excellent, it is preferable to use an amine-based compound as the hole injection material.

The average thickness of the hole injection layer 4 is not particularly limited but is preferably 1 to 100 nm and more preferably 1 to 80 nm. Due to this, it is possible to lower the driving voltage of the light emitting element 1.

Hole Transportation Layer

The hole transportation layer 5 is provided to come into contact with the hole injection layer 4. The hole transportation layer 5 has a function of transporting holes which are injected from the anode 3 via the hole injection layer 4 to the red light emitting layer 61. As the constituent material of the hole transportation layer 5 (a hole transportation material), it is possible to use various types of p-type polymer materials or various types of p-type low molecular materials individually or in combination. For example, it is possible to use an amine-based compound which has amine in the chemical structure as the hole transportation material.

The amine-based compound is a material to which holes are able to be easily injected in order that electrons are favorably extracted by the hole injection material. For this reason, by using an amine-based compound as the constituent material of the hole transportation layer 5, it is possible to favorably inject holes which are injected from the anode 3 via the hole injection layer 4 to the hole transportation layer 5. Due to this, it is possible to favorably drive the light emitting element 1 even at a lower voltage.

Examples of the amine-based compound include N,N'-di (1-naphthyl)-N,N'diphenyl-1,1'-biphenyl-4,4'-diamine (α-NPD) shown in formula (2) below, N,N'-diphenyl-N,N'-bis(3-methylphenyl)-1,1'-biphenyl-4,4'-diamine (TPD), a tetraarylbenzidine derivative such as a compound which is represented by formula (3) below and a compound which is represented by formula (4) below, a tetraaryl diaminofluorene compound or a derivative thereof, and the like. As the amine-compound, it is possible to use one type out of these or to combine two types or more.

[Chem. 4]

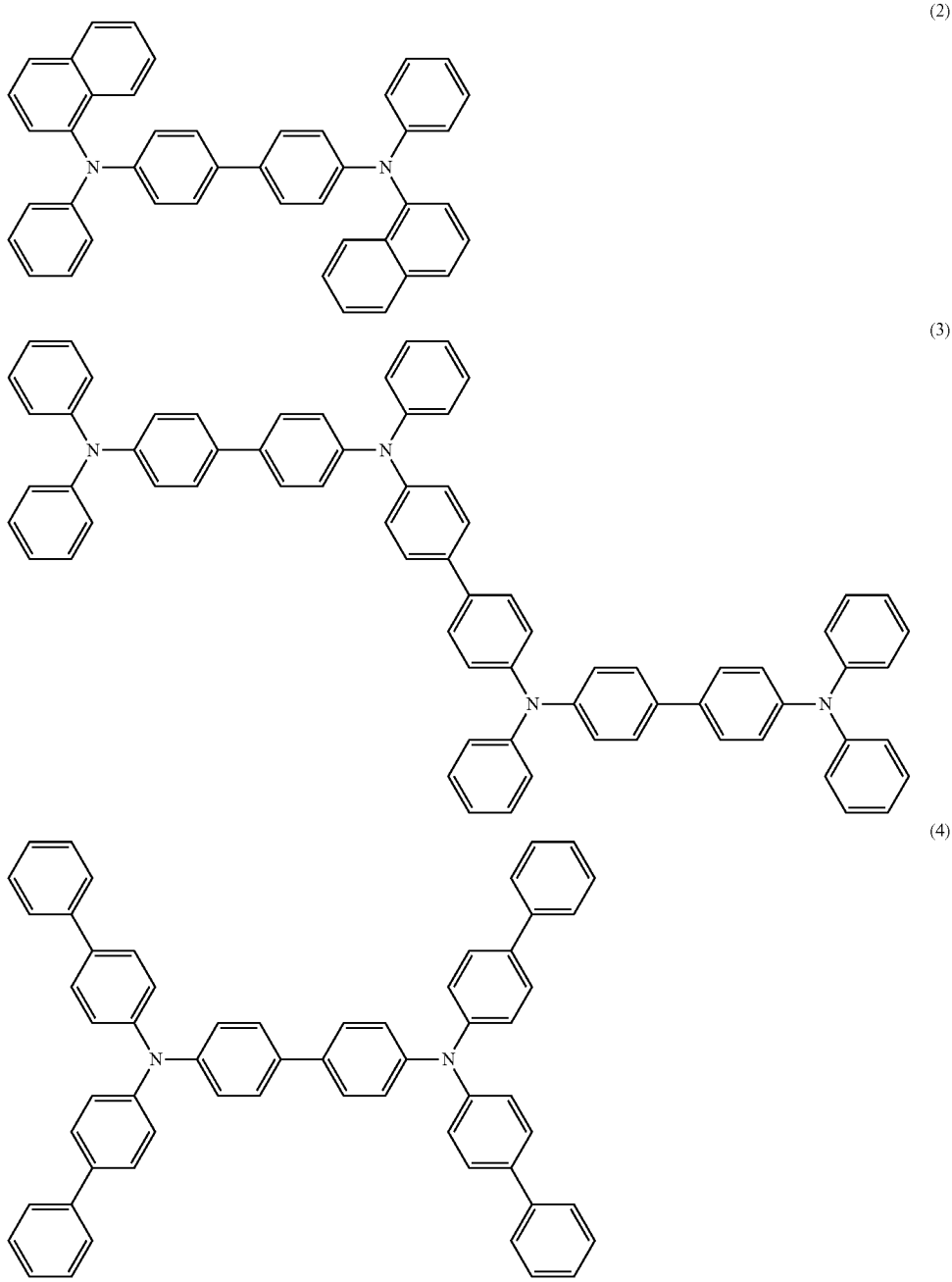

(2)

(3)

(4)

Among these, it is preferable to use N,N'-di(1-naphthyl)-N,N'diphenyl-1,1'biphenyl-4,4'-diamine (α-NPD) shown in formula (2) described above as an amine-based compound. With these compounds, electrons are more favorably extracted by the hole injection material. For this reason, holes are particularly easily injected to the hole transportation layer 5. As a result, it is possible for the light emitting element 1 to be favorably driven even at a lower voltage.

The average thickness of the hole transportation layer 5 is not particularly limited but is preferably 10 to 150 nm and more preferably 10 to 100 nm.

Light Emitting Section

As described above, the light emitting section 6 is a laminated body where the red light emitting layer (the first light emitting layer) 61, the intermediate layer 62, the blue light emitting layer (the second light emitting layer) 63, and the green light emitting layer (the third light emitting layer) 64 are laminated from the anode 3 side.

Below, description will be sequentially given of each of the layers. Here, in the present embodiment, as described below, the blue light emitting layer (the second light emitting layer) 63 and the green light emitting layer (the third light emitting layer) 64 are configured in the light emitting layer according to the light emitting element of the invention.

Red Light Emitting Layer

The red light emitting layer (the first light emitting layer) 61 is configured to include a red light emitting material (a first light emitting material) which emits red (a first color) light and a host material which holds a red light emitting material (a first host material) in the present embodiment.

The red light emitting material is not particularly limited. As the red light emitting material, it is possible to use various types of red fluorescent materials and red phosphorescent materials individually or in a combination of two types or more thereof.

The red fluorescent material is not particularly limited as long as red fluorescent light is emitted. Examples of red fluorescent materials include a perylene derivative such as a tetraaryl diindeno perylene derivative shown in formula (5) below, a europium complex, a benzopyran derivative, a rhodamine derivative, a benzothioxanthene derivative, a porphyrin derivative, nile red, 2-(1,1-dimethylethyl)-6-(2-(2,3,6,7-tetrahydro-1,1,7,7-tetramethyl-1H,5H-benzo(ij) quinolizine-9-il)ethenyl)-4H-pyran-4H-ylidene)propanedinitrile (DCJTB), 4-(dicyanomethylene)-2-methyl-6-(p-dimethylaminostyryl)-4H-pyran (DCM), and the like.

The red phosphorescent material is not particularly limited as long as red phosphorescent light is emitted. Examples of red phosphorescent material include metal complexes such as iridium, ruthenium, platinum, osmium, rhenium, and palladium. In addition, examples include metal complexes where at least one out of ligands of these metal complexes have a phenyl pyridine frame, a bipyridyl frame, a porphyrin frame, and the like. In more detail, examples include tris(1-phenyl isoquinoline)iridium, bis[2-(2'benzo[4,5-α]thienyl) pyridinate-N,C$^{3'}$]iridium(acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,C$^{3'}$]iridium, and bis(2-phenylpyridyn)iridium(acetylacetonate).

In addition, in addition to a red light emitting material (a light emitting material), the red light emitting layer 61 includes a host material (a first host material) where the red light emitting material is a guest material. The host material has a function of generating excitons by recombining holes and electrons and exciting the red light emitting material by moving the energy of the excitons in the red light emitting material (Forster movement or Dexter movement). Such a host material is used, for example, by doping the red light emitting material which is the guest material in the host material as a light emitting dopant.

The first host material is not particularly limited as long as the function described above is exhibited with respect to the red light emitting material to be used. In a case where the red light emitting material includes a red fluorescent material, examples of the first host material include an anthracene derivative as shown in formula (6) below, an anthracene derivative such as 2-t-butyl-9,10-di(2-naphthyl)anthracene (TBADN), an acene derivative (an acene-based compound) such as a naphthacene derivative shown in formula (7) below, a distyryl arylene derivative, a perylene derivative, a distyryl benzen derivative, a distyryl amine derivative, a quinolinolato-based metal complex such as a tris(8-quinolinolato)aluminum complex (ALq$_3$), a triarylamine derivative such as a tetramer of triphenylamine, an oxadiazole derivative, a silole derivative, a dicarbazole derivative, an oligothiophene derivative, a benzopyran derivative, a triazole derivative, a benzoxazole derivative, a benzothiazole derivative, a quinoline derivative, 4,4'-bis(2,2'-diphenylvinyl)biphenyl(DPVBi), and the like. As the first host material, it is possible to use one type out of these individually or to combine two types or more.

In addition, in a case where the red light emitting material includes a red phosphorescent material, examples of the first host material include a carbazole derivative such as 3-phenyl-4-(1'-naphthyl)-5-phenylcarbazole, 4,4'-N,N'-dicarbazole biphenyl(CBP) and the like and it is possible to use one type out of these individually or to combine two types or more.

[Chem. 5]

(5)

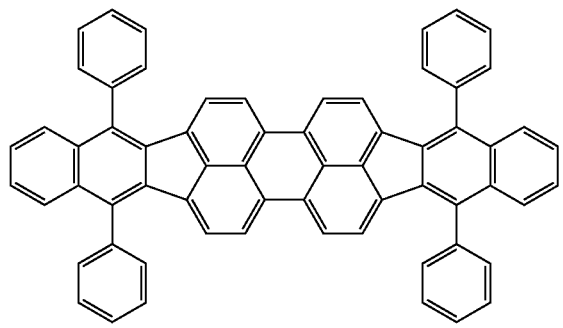

[Chem. 6]

(6)

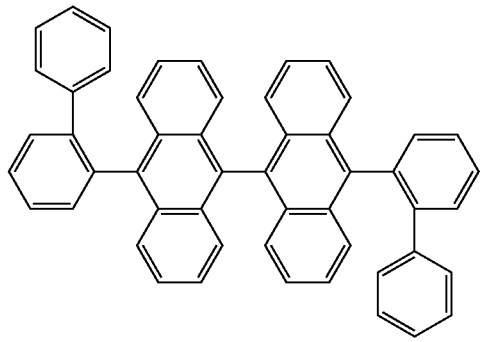

-continued

[Chem. 7]

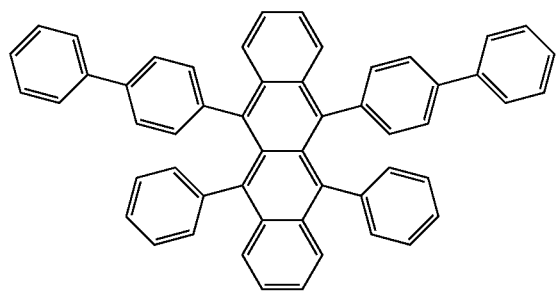

(7)

The content (the doping amount) of the red light emitting material in the red light emitting layer 61 is preferably 0.01 to 10 wt % and more preferably 0.1 to 5 wt %. By setting the content of the red light emitting material within such a range, it is possible to optimize the light emitting efficiency and it is possible to emit light from the red light emitting layer 61 while keeping a balance with the light emitting amounts of the blue light emitting layer 63 or the green light emitting layer 64 which will be described below.

In addition, the average thickness of the red light emitting layer 61 is not particularly limited, but is preferably approximately 1 to 20 nm and more preferably approximately 3 to 10 nm.

Intermediate Layer

The intermediate layer 62 is provided between the red light emitting layer 61 described above and the blue light emitting layer 63 which will be described below. The intermediate layer 62 has a function of adjusting the amount of electrons which are transported from the blue light emitting layer 63 to the red light emitting layer 61 and has a function of adjusting the amount of holes which are transported from the red light emitting layer 61 to the blue light emitting layer 63. In addition, the intermediate layer 62 has a function of preventing the energy of excitons from moving between the red light emitting layer 61 and the blue light emitting layer 63. According to these functions, it is possible to efficiently emit light from each of the red light emitting layer 61 and the blue light emitting layer 63. For this reason, it is possible to emit light from each light emitting layer in a well-balanced manner and the light emitting element 1 is able to emit light of a target color (white in the present embodiment). As a result, it is possible to improve the light emitting efficiency and light emitting life span of the light emitting element 1.

The constituent material of the intermediate layer 62 is not particularly limited as long as the intermediate layer 62 is able to exhibit the functions described above. For example, it is possible to use a material which has a function of transporting holes (a hole transportation material), a material which has a function of transporting electrons (an electron transportation material), and the like.

The hole transportation material which is able to be used for the intermediate layer 62 is not particularly limited as long as the intermediate layer 62 exhibits the function described above and for example, it is possible to use an amine-based compound which has an amine skeleton out of the hole transportation materials described above and it is preferable to use a benzidine-based amine derivative.

In particular, among benzidine-based amine derivatives, a benzidine-based amine derivative where two or more aromatic ring groups are introduced is preferable as the amine-base compound which is used for the intermediate layer 62 and a tetraarylbenzidine derivative is more preferable. Examples of such a benzidine-based amine derivative include N,N'-di(1-naphthyl)-N,N'-diphenyl[1,1'-biphenyl]-4,4'-diamine (α-NPD) shown in formula (2), N,N,N',N'-tetranaphthyl-benzine (TNB), and the like. Such an amine-based compound generally has an excellent hole transportation property. Accordingly, the intermediate layer 62 where such an amine-based compound is used is able to smoothly deliver holes which are injected via the red light emitting layer 61 to the blue light emitting layer 63.

The electron transportation material which is able to be used for the intermediate layer 62 is not particularly limited as long as the intermediate layer 62 exhibits the function described above and for example, it is possible to use an acene-based compound. The acene-based compound has an excellent electron transportation property. For this reason, the intermediate layer 62 where the acene-based compound is used is able to smoothly deliver electrons from the blue light emitting layer 63 to the red light emitting layer 61. In addition, since an acene-based compound has an excellent system with respect to excitons, deterioration due to excitons of the intermediate layer 62 is prevented or suppressed and as a result, it is possible to make the durability of the light emitting element 1 excellent.

Examples of such an acene-based compound include a naphthalene derivative, an anthracene derivative, a tetracene derivative, a pentacene derivative, a hexacene derivative, a heptacene derivative, and the like and it is possible to use one type out of these or combine two types or more. Among these, it is preferable to use a naphthalene derivative and an anthracene derivative and more preferable to use an anthracene derivative. Examples of the anthracene derivative include the anthracene derivative shown in formula (6), 2-t-butyl-9,10-di-2-naphthyl anthracene (TBADN), and the like.

Furthermore, as the constituent material of such the intermediate layer 62, the same constituent materials as described as the first host material of the red light emitting layer 61 may be used and the same constituent materials as the constituent materials which will be described below as a second assist dopant material of the blue light emitting layer 63 may be used.

In addition, the average thickness of the intermediate layer 62 is not particularly limited, but is preferably approximately 5 to 50 nm and more preferably approximately 10 to 30 nm.

Blue Light Emitting Layer

The blue light emitting layer (the second light emitting layer) 63 is configured to include a blue light emitting material (a second light emitting material) which emits blue (a second color) light, a host material (a second host material) which holds the blue light emitting material, and an assist dopant material (a second assist dopant material) which has opposite mobility with respect to the host material in the present embodiment.

The blue light emitting material is not particularly limited and it is possible to use various types of blue fluorescent materials and blue phosphorescent materials individually or in a combination of two types or more thereof.

The blue fluorescent material is not particularly limited as long as blue fluorescent light is emitted. Examples of blue fluorescent material include distyryl amine derivatives such as a distyryl amine-based compound shown in formula (8) below, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyryl benzen derivatives, tetraphenyl butadiene, 4,4'-bis(9-ethyl-3-carbazovinylene)-1,1'-biphenyl(BCzVBi), poly[(9,9-dioctyl fluorene-2,7-diil)-co-(2,5-dimethoxybenzene-1,4-diil)], poly[(9,9-dihexyloxyfluorene-2,7-diil)-ortho-co-(2-methoxy-5-{2-ethoxyhexyloxy}phenylene-1,4-diil)], poly[(9,9-dioctyl fluorene-2,7-diil)-co-(ethylnylbenzene)], and the like. As the blue fluorescent material, it is possible to use one type out of these individually or to combine two types or more.

[Chem. 8]

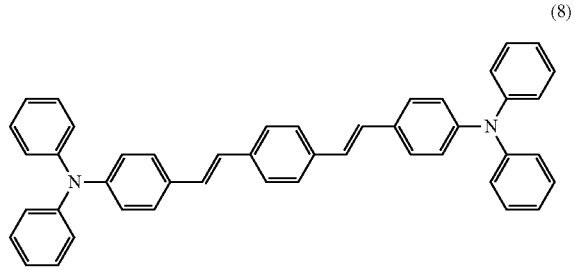

(8)

The blue phosphorescent material is not particularly limited as long as blue phosphorescent light is emitted. Examples of a blue phosphorescent material include a metal complex such as iridium, ruthenium, platinum, osmium, rhenium, and palladium. In more detail, examples include bis[4,6-diflueorophenylpiridinate-N,C$^{2'}$]-picolinate-iridium, tris[2-(2,4-difluorophenyl)piridinate-N,C$^{2'}$]iridium, bis[2-(3,5-trifluoromethyl)piridinate-N,C$^{2'}$]-picolinate-iridium, and bis(4,6-diflueorophenylpiridinate-N,C$^{2'}$)iridium(acetylacetonate).

In addition, in addition to the blue light emitting material (a light emitting material), a host material (a second host material) where the blue light emitting material is a guest material is included as a constituent material of the blue light emitting layer 63. The second host material has a function of generating excitons by recombining holes and electrons and exciting a blue light emitting material by moving the energy of the excitons in the blue light emitting material (Forster movement or Dexter movement). It is possible to use the second host material, for example, by doping a blue light emitting material which is a guest material in the host material as a light emitting dopant. As such a second host material, it is possible to use the same material as the material described as the first host material of the red light emitting layer 61. Among these, an acene-based compound is preferable as the second host material. Since the acene-based compound is a host material with a high electron transportation property, an acene-based compound is favorably used as a host material of the blue light emitting layer 63 where it is necessary to smoothly supply electrons to the red light emitting layer 61 side.

In addition, in addition to a blue light emitting material (a light emitting material) and a host material (a second host material), an assist dopant material (a second assist dopant material) is included as a constituent material of the blue light emitting layer 63.

The second assist dopant material has opposite mobility with respect to a second host material so as to assist the second host material. That is, the second assist dopant material is a material with a high hole transportation property in a case where the second host material is a material with a high electron transportation property and a material with a high electron transportation property in a case where the second host material is a material with a high hole transportation property. In this manner, the second assist dopant material is able to cause holes and electrons to flow in the blue light emitting layer 63 in a well-balanced manner by having opposite mobility with respect to the second host material. As a result, a function of adjusting the position in the thickness direction at which excitons are generated by holes and electrons being recombined is exhibited. That is, it is possible to sufficiently separate a position where carriers are recombined from the vicinity of the interface of the blue light emitting layer 63. The second assist dopant material is used, for example, by being mixed with the second host material.

Here, since it is necessary for the blue light emitting layer 63 of the present embodiment to smoothly supply electrons to the red light emitting layer 61 side, a material with a high electron transportation property is used as the second host material. In this case, a material with a high hole transportation property is favorably selected as the second assist dopant material.

The second assist dopant material is not particularly limited as long as the material has opposite mobility with respect to the second host material. Examples of the second assist dopant material include N,N'-di(1-naphthyl)-N,N'-diphenyl-1,1'-biphenyl-4,4'-diamine (α-NPD) shown in formula (2) below, N,N'-diphenyl-N,N'-bis(3-methylphenyl)-1, 1'-biphenyl-4,4'diamine (TPD), a tetraarylbenzidine derivative such as a compound which is represented by formula (3) below and a compound which is represented by formula (4) below, a tetraaryl diaminofluorene compound or the derivative thereof (an amine-based compound), oxadiazole derivatives, perylene derivatives, pyridine derivatives, pyrimidine derivatives, quinoxaline derivatives, diphenylquinone derivatives, and the like. As the second assist dopant material, it is possible to use one type out of these individually or to combine two types or more.

[Chem. 9]

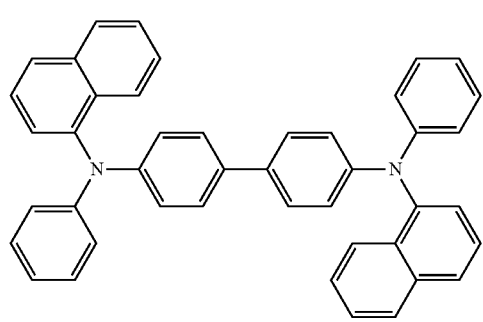

(2)

-continued

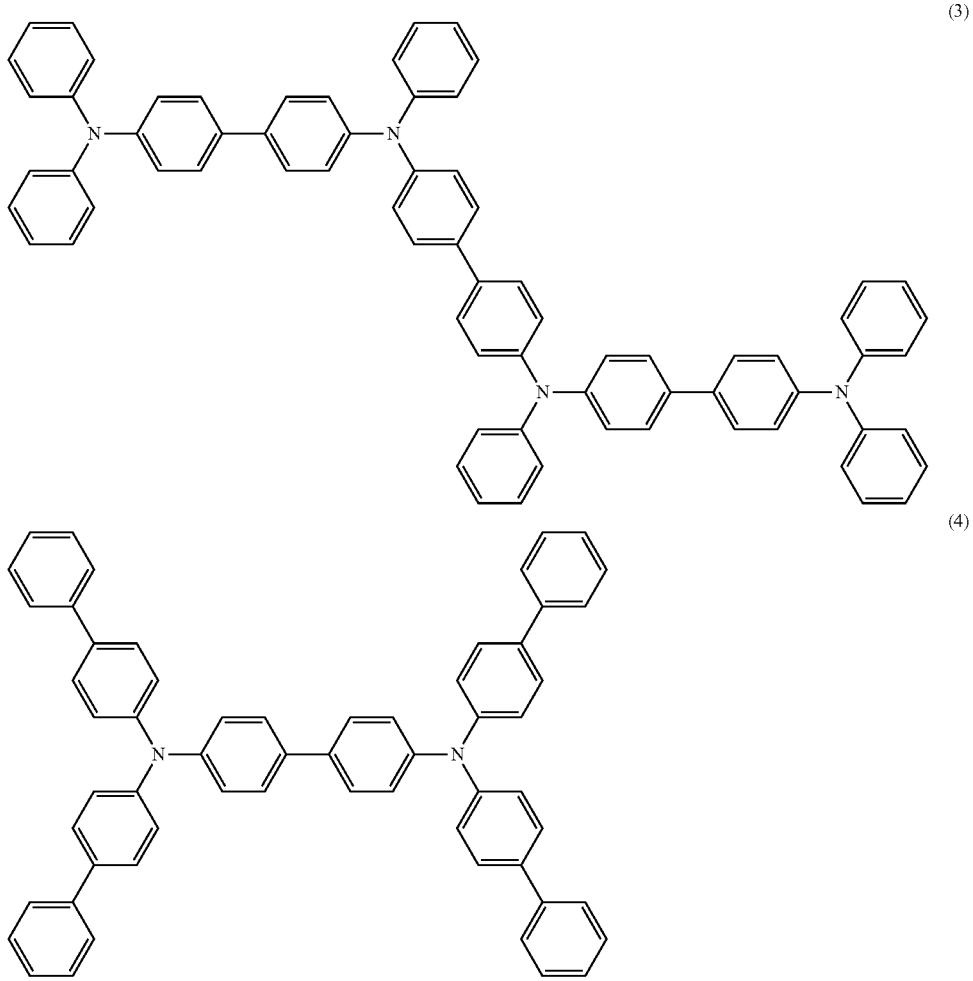

(3)

(4)

The content (a doping amount) of the blue light emitting material in the blue light emitting layer 63 is preferably 0.01 to 20 wt % and more preferably 1 to 15 wt %. By setting the content of the blue light emitting material within such a range, it is possible to optimize the light emitting efficiency and it is possible to emit light from the blue light emitting layer 63 while keeping a balance between the light emitting amount of the red light emitting layer 61 and the light emitting amount of the green light emitting layer 64 which will be described below.

In addition, the average thickness of the blue light emitting layer 63 is not particularly limited but is preferably approximately 5 to 50 nm and more preferably approximately 10 to 40 nm.

Green Light Emitting Layer

The green light emitting layer (the third light emitting layer) 64 is configured to include a green light emitting material (a third light emitting material) which emits green (a third color) light, a host material (a third host material) which holds the green light emitting material, an assist dopant material (a third assist dopant material) which has opposite mobility with respect to the host material.

The green light emitting material is not particularly limited and it is possible to use various types of green fluorescent materials and green phosphorescent materials individually or in a combination of two types or more thereof.

The green fluorescent material is not particularly limited as long as green fluorescent light is emitted. Examples of the green fluorescent material include coumarin derivatives, quinacridone and derivatives thereof such as a quinacridone derivative shown in formula (9) below, 9,10-bis[(9-ethyl-3-carbazole)-vinylenyl-anthracene, poly(9,9-dihexyl-2,7-vinylenfluorenylene), poly[(9,9-dioctyl fluorene-2,7-diil)-co-(1,4-diphenylene-vinylene-2-methoxy-5-{2-ethylhexyloxy}benzene)], poly[(9,9-dioctyl-2,7-divinylenefluolenylene)-ortho-co-(2-methoxy-5-(2-ethoxylhexyloxy)-1,4-phenylene)], and the like. As the green fluorescent material, it is possible to use one type out of these individually or to combine two types or more.

[Chem. 10]

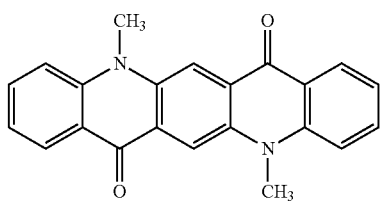

(9)

The green phosphorescent material is not particularly limited as long as green phosphorescent light is emitted. Examples of green phosphorescent material include metal complexes such as iridium, ruthenium, platinum, osmium, rhenium, and palladium. Among these, a metal complex where at least one out of ligands of these metal complexes has a phenyl pyridine skeleton, a bipyridyl skeleton, a porphyrin skeleton, or the like is preferable. In more detail, examples include fac-tris(2-phenylpridine)iridium (Ir(ppy)3), bis(2-phenylpiridinate-N,$C^{2'}$)iridium(acetylacetonate), fac-tris[5-fluoro-2-(5-trifluoromethyl-2-piridine)phenyl-C, N]iridium, and the like.

In addition, as well as the green light emitting material (a light emitting material), a host material (a third host material) where the green light emitting material is a guest material is included as a constituent material of the green light emitting layer 64. The third host material has a function of generating excitons by recombining holes and electrons and exciting the green light emitting material by moving the energy of the excitons in the green light emitting material (Forster movement or Dexter movement). It is possible to use the third host material, for example, by doping a green light emitting material which is a guest material in the host material as a light emitting dopant. As the third host material, it is possible to use the same material as the material described as the first host material of the red light emitting layer 61. Among these, an acene-based compound is preferable as the third host material. The acene-based compound is a host material with a high electron transportation property. For this reason, the third host material where the acene-based compound is used is favorably used as the host material of the green light emitting layer 64 where it is necessary to smoothly supply electrons to the red light emitting layer 61 side.

In addition, in addition to the green light emitting material (a light emitting material) and the host material (a third host material), an assist dopant material (a third assist dopant material) which has opposite mobility with respect to the third host material so as to assist the third host material is included as a constituent material of the green light emitting layer 64.

The third assist dopant material has opposite mobility with respect to the third host material in the same manner as the relationship between the second assist dopant material and the second host material. Due to this, a function of adjusting the position in the thickness direction at which excitons are generated by holes and electrons being recombined is exhibited in the green light emitting layer 64. That is, it is possible to sufficiently separate the position at which carriers are recombined from the vicinity of the interface of the green light emitting layer 64. The third assist dopant material is used, for example, by being mixed with the third host material.

As the third assist dopant material, for example, it is possible to use the same material as the material which is described as the second assist dopant material of the blue light emitting layer 63.

Here, since it is necessary for the green light emitting layer 64 of the present embodiment to smoothly supply electrons to the red light emitting layer 61 side in the same manner as the blue light emitting layer 63, in a case where a material with a high electron transportation property is used as the third host material, a material with a high hole transportation property is favorably selected as the third assist dopant material.

The content (a doping amount) of the green light emitting material in the green light emitting layer 64 is preferably 0.01 to 20 wt % and more preferably 0.5 to 15 wt %. By setting the content of the green light emitting material within such a range, it is possible to optimize the light emitting efficiency and it is possible to emit light from the green light emitting layer 64 while keeping a balance between the light emitting amount of the red light emitting layer 61 and the light emitting amount of the blue light emitting layer 63.

In addition, the average thickness of the green light emitting layer 64 is not particularly limited but is preferably approximately 5 to 50 nm and more preferably approximately 10 to 40 nm.

As described above, the blue light emitting layer 63 and the green light emitting layer 64 (the light emitting layers 63 and 64) each include a light emitting material, a host material, and an assist dopant material which has opposite mobility with respect to the host material.

In this manner, by the light emitting layers 63 and 64 including an assist dopant material which has opposite mobility with respect to the host material, it is possible to control the carrier transportation property in the light emitting layers 63 and 64. Due to this, the position in the thickness direction at which excitons are generated by holes and electrons being recombined is adjusted. That is, it is possible to sufficiently separate the position at which carriers are recombined from the vicinity of each interface of the light emitting layers 63 and 64. As a result, since it is possible to prevent only a portion of a light emitting material in the light emitting layers 63 and 64 from contributing to the emitted light, it is possible to suppress local deterioration in a light emitting material which is positioned in the vicinity of the interface and to suppress deterioration in the brightness of the light emitting layers 63 and 64. Due to this, it is possible to achieve high efficiency in the light emitting element 1 and extend the life span thereof. However, simply by including an assist dopant material or controlling a relationship of HOMO and LUMO with the host material and the assist dopant material, it is not possible to sufficiently control the carrier transportation property of the holes and electrons and it is not possible to set the recombination position of the carriers in the light emitting layers 63 and 64 to a favorable position. That is, it is not possible to sufficiently separate the position at which carriers are recombined in the light emitting layers 63 and 64 from the vicinity of an interface with a layer which is adjacent to the light emitting layers 63 and 64.

In contrast, in the invention, when the mobility of holes is μh [cm²/Vs] and the mobility of electrons is μe [cm²/Vs] in the light emitting layers 63 and 64 which include the assist dopant material, a mobility ratio μe/μh is set so as to satisfy the relationship of formula (I) below. That is, in the invention, the relationship between the mobility of holes and the mobility of electrons in the light emitting layers 63 and 64 is controlled.

$$0.01 \leq \mu e/\mu h \leq 100 \qquad (I)$$

By satisfying the relationship, it is possible to cause holes and electrons to flow in the light emitting layers 63 and 64 in a well-balanced manner. For this reason, it is possible to sufficiently separate a position at which carriers are recombined (a recombination site) from a vicinity of the interface with a layer which is adjacent to the light emitting layers 63 and 64 and it is possible to expand the recombination site. As a result, local deterioration of the light emitting material (the dopant material) in the vicinity of the interface is suppressed. Due to this, the light emitting element 1 has excellent light emitting characteristics and a life span characteristic of maintaining the light emitting characteristics over a long period.

Here, it is possible to determine the value of the mobility ratio $\mu e/\mu h$ by measuring the hole mobility and the electron mobility of the light emitting layer by impedance spectroscopy and obtaining the ratio thereof.

Here, as shown in formula (I), the value $\mu e/\mu h$ may be 0.01 or more to 100 or less but is preferably 0.1 or more to 10 or less. Due to this, it is possible to more reliably expand the recombination site in the light emitting layers 63 and 64.

In addition, the size of the value $\mu e/\mu h$ is adjusted by appropriately selecting the type and the content of an assist dopant according to the type and the content of a host material which is included in the light emitting layers 63 and 64. In more detail, in a case of using the acene-based compound described above as the host material, an amine-based compound is preferable as the assist dopant material. Due to this, it is possible to easily set the size of the value $\mu e/\mu h$ within a range of 0.01 or more to 100 or less.

Furthermore, an acene-based compound is preferably a compound which is represented by formula (4). Due to this, it is possible to more remarkably exhibit these effects.

In addition, the content of the assist dopant material is preferably 20 wt % or more to 70 wt % or less in the light emitting layers 63 and 64 and more preferably 20 wt % or more to 50 wt % or less. By setting the content of the assist dopant material within this range, it is possible to easily set the size of the value $\mu e/\mu h$ within a range of 0.01 or more to 100 or less. That is, in a case where the assist dopant material is a material with a high hole transportation property, when the content of an assist dopant material is less than the lower limit, it is not possible to sufficiently separate the recombination site from the vicinity of the interface with a layer with which the light emitting layers 63 and 64 come into contact on the anode side depending on the type of the assist dopant material and there is a concern that it will not be possible to suppress local deterioration of the light emitting material in the vicinity of the interface. In addition, when the content of the assist dopant material exceeds the upper limit, an excessive amount of holes reach a layer which comes into contact with the light emitting layers 63 and 64 on a cathode side depending on the type of the assist dopant material and, due to this, changes in quality and deterioration of the layer reached by the holes occur and there is a concern that the characteristics of the light emitting element 1 will be negatively affected.

In the invention, furthermore, in the light emitting layers 63 and 64 which include a light emitting material, a host material, and an assist dopant material, it is preferable that the relational formula (A) below is satisfied when a HOMO level, a LUMO level, a mobility of holes, and a mobility of electrons in the host material are respectively $HOMO_{Host}$, $LUMO_{Host}$, $\mu h_{Host}$, and $\mu e_{Host}$, and a HOMO level, a LUMO level, a mobility of holes, and a mobility of electrons in the assist dopant material are respectively $HOMO_{Assist}$, $LUMO_{Assist}$, $\mu h_{Assist}$, and $\mu e_{Assist}$. In other words, in the invention, in the light emitting layers 63 and 64, it is preferable that the combination of the host material and the assist dopant material is set so as to satisfy the relational formula (A) below.

$$HOMO_{Assist}+0.2\ eV<HOMO_{Host}$$

$$LUMO_{Host}>LUMO_{Assist}+0.2\ eV$$

$$\mu h_{Host}<\mu h_{Assist}$$

$$\mu e_{Host}>\mu e_{Assist} \quad\quad\quad (A)$$

In this manner, in the invention, it is preferable to not only regulate the relationship of HOMO and LUMO with a host material and an assist dopant material but also to regulate a relationship of a mobility of holes and electrons with the host material and the assist dopant material. Due to this, since it is possible to sufficiently separate the position at which carriers are recombined in the light emitting layers 63 and 64 from the vicinity of the interface with a layer which is adjacent to the light emitting layers 63 and 64 and it is possible to expand the recombination site, local deterioration of the light emitting material (the dopant material) in the vicinity of the interface is suppressed. As a result, the light emitting element 1 has excellent light emitting characteristics and a life span characteristic of maintaining the light emitting characteristics over a long period.

In order to obtain the effect, firstly, by satisfying a relationship of $HOMO_{assist}+0.2\ eV<HOMO_{Host}$, the HOMO level is set such that holes reliably flow in the assist dopant material. Then, at this time, since the relationship $\mu h_{Host}<\mu h_{Assist}$ is satisfied, it is possible to reliably obtain the effect which is obtained by adding an assist dopant material, that is, the effect that the hole transportation property is increased in the light emitting layers 63 and 64.

In addition, in order to satisfy the relationship of $LUMO_{Host}>LUMO_{Assist}+0.2\ eV$, the LUMO level is set such that electrons reliably flow in the host material. Then at this time, since a relationship $\mu e_{Host}>\mu e_{Assist}$ is satisfied, even when the assist dopant material is added, it is possible to accurately suppress or prevent the electron transportation property from being inhibited due to the host material in the light emitting layers 63 and 64.

From the above, since it is possible to sufficiently separate a position at which carriers are recombined in the light emitting layers 63 and 64 from the vicinity of the interface with a layer which is adjacent to the light emitting layers 63 and 64 by adding an assist dopant material to the light emitting layers 63 and 64, it is possible to reliably obtain the effects as described above.

By combining a host material and an assist dopant material which satisfy the relational formula (A), it is possible to easily satisfy a relationship of formula (I) and due to this, it is possible to cause holes and electrons to flow in the light emitting layers 63 and 64 in a more well-balanced manner. Therefore, it is possible to more reliably exhibit these effects since it is possible to reliably separate a position at which carriers are recombined (the recombination site) from the vicinity of the interface with a layer which is adjacent to the light emitting layers 63 and 64 and it is possible to expand the recombination site.

Electron Transportation Layer

The electron transportation layer 7 has a function of transporting electrons which are injected from the cathode 9 via the electron injection layer 8 to the green light emitting layer 64.

Examples of constituent materials (the electron transportation material) of the electron transportation layer 7 include a phenanthroline derivative such as 2,9-dimethyl-4,7-diphenyl-1,10-phenanthroline (BCP), a quinoline derivative such as an organic metal complex which has 8-quinolinol or a derivative thereof such as tris(8-quinolinolato)aluminum (Alq$_3$) shown in formula (10) below as a ligand, azaindolenine lysine derivatives such as a compound shown in formula (11), oxadiazole derivatives, perylene derivatives, pyridine derivatives, pyrimidine derivatives, quinoxaline derivatives, diphenylquinone derivatives, nitro substituted fluorene derivatives, and the like. As the electron transpor-

[Chem. 11]

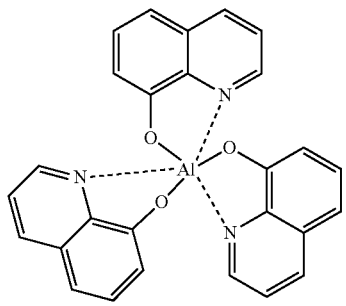

(10)

[Chem. 12]

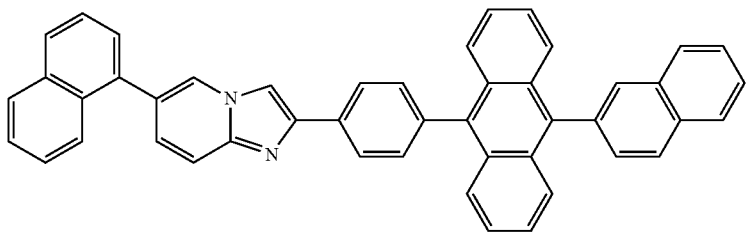

(11)

The average thickness of the electron transportation layer 7 is not particularly limited but is preferably approximately 0.5 to 100 nm and more preferably approximately 1 to 50 nm.

Electron Injection Layer

The electron injection layer 8 has a function of improving the electron injection efficiency from the cathode 9.

Examples of the constituent material (an electron injection material) of the electron injection layer 8 include various types of inorganic insulation materials and various types of inorganic semiconductor materials.

Examples of such an inorganic insulation material include alkaline metal chalcogenides (oxides, sulfides, selenides, and tellurides), alkaline earth metal chalcogenides, alkaline metal halogenides, alkaline earth metal halogenides, and the like. As the electron injection material, it is possible to use one type out of these or to combine two types or more. By configuring the electron injection layer 8 to have these as main materials, it is possible to further improve the electron injection property. In particular, the work function of an alkali metal compound (alkaline metal chalcogenides, alkaline metal halogenides, and the like) is extremely small and by using this to configure the electron injection layer 8, the light emitting element 1 is able to obtain high brightness.

Examples of alkaline metal chalcogenides include $Li_2O$, LiO, $Na_2S$, $Na_2Se$, NaO, and the like.

Examples of alkaline earth metal chalcogenides include CaO, BaO, SrO, BeO, BaS, MgO, CaSe, and the like.

Examples of alkaline metal halogenides include CsF, LiF, NaF, KF, LiCl, KCl, NaCl, and the like.

Examples of alkaline earth metal halogenides include $CaF_2$, $BaF_2$, $SrF_2$, $MgF_2$, $BeF_2$, and the like.

In addition, examples of the inorganic semiconductor material include oxides, nitrides, oxynitrides, and the like which include at least one element out of Li, Na, Ba, Ca, Sr, Yb, Al, Ga, In, Cd, Mg, Si, Ta, Sb, and Zn. As the inorganic semiconductor material, it is possible to use one type out of these or to combine two types or more.

The average thickness of the electron injection layer 8 is not particularly limited but is preferably approximately 0.1 to 1000 nm, more preferably approximately 0.2 to 100 nm, and even more preferably approximately 0.2 to 50 nm.

Sealing Member

The sealing member 10 is provided so as to cover the anode 3, the laminated body 15, and the cathode 9 and has a function of hermetically sealing these and interrupting oxygen or water. By providing the sealing member 10, it is possible to obtain effects such as improvement in the reliability of the light emitting element 1, prevention of changes in quality and deterioration (durability improvement), and the like.

Examples of constituent materials of the sealing member 10 include Al, Au, Cr, Nb, Ta, and Ti or an alloy which includes these, a silicon oxide, various types of resin materials, and the like. Here, in a case of using a material with conductivity as a constituent material of the sealing member 10, it is preferable to provide an insulating film between the sealing member 10 and the anode 3, the laminated body 15, and the cathode 9 as necessary in order to prevent short-circuits.

In addition, the sealing member 10 may oppose the substrate 2 as a flat shape and an interval therebetween may be sealed by a sealing material such as, for example, a thermosetting resin. For example, it is possible to manufacture the light emitting element 1 described above as follows.

1. Firstly, the substrate 2 is prepared and the anode 3 is formed on the substrate 2. It is possible to form the anode 3 using, for example, a chemical vapor deposition (CVD) such as a plasma CVD and a thermal CVD, a dry plating method such as a vacuum deposition, a wet plating method such as electroplating, a spraying method, a sol-gel method, a MOD method, metallic foil bonding, or the like.

2. Next, the hole injection layer 4 is formed on the anode 3. It is possible to form the hole injection layer 4, for example, by a vapor phase process which uses a CVD method, dry plating methods such as vacuum deposition and sputtering, or the like.

In addition, it is also possible to form the hole injection layer 4, for example, by drying (removing the solvent or dispersion medium) after supplying a material for forming the hole injection layer formed by dissolving a hole injection material in a solvent or dispersing a hole injection material in a dispersion medium on the anode 3.

It is also possible to use various types of coating methods such as, for example, a spin coating method, a roll coating method, and an ink jet printing method as a method for supplying the material for forming a hole injection layer. By using these coating methods, it is possible to comparatively easily form the hole injection layer 4.

Examples of the solvent or the dispersion medium which is used for preparing the material for forming a hole injection layer include various types of inorganic solvents, various types of organic solvents, mixed solvents which include both of these, or the like.

Here, it is possible to perform drying, for example, by leaving the result to stand in atmospheric pressure or reduced-pressure atmosphere, performing a heating process, spraying an inert gas, or the like.

In addition, prior to the present process, oxygen plasma processing may be carried out on an upper surface of the anode 3. Due to this, it is possible to add lyophilicity to the upper surface of the anode 3, to remove (clean) organic materials which are attached to the upper surface of the anode 3, to adjust a work function in the vicinity of the upper surface of the anode 3, and the like.

Here, as conditions of the oxygen plasma processing, for example, it is preferable that the plasma power is approximately 100 to 800 W, the oxygen gas flow rate is approximately 50 to 100 mL/min, the transportation speed of the processed member (the anode 3) is approximately 0.5 to 10 mm/sec, and the temperature of the substrate 2 is approximately 70 to 90° C.

3. Next, the hole transportation layer 5 is formed on the hole injection layer 4. It is possible to form the hole transportation layer 5, for example, by a vapor phase process which uses a CVD method, dry plating methods such as vacuum deposition and sputtering, or the like.

In addition, it is also possible to form the hole transportation layer 5, for example, by carrying out drying (removing the solvent or dispersion medium) after supplying a material for forming a hole transportation layer formed by dissolving a hole transportation material in a solvent or dispersing a hole transportation material in a dispersion medium on the hole injection layer 4.

4. Next, the red light emitting layer 61 is formed on the hole transportation layer 5. It is possible to form the red light emitting layer 61, for example, by a vapor phase process which uses a CVD method, a dry plating method such as a vacuum deposition and a sputtering, and the like.

5. Next, the intermediate layer 62 is formed on the red light emitting layer 61. It is possible to form the intermediate layer 62, for example, by a vapor phase process which uses a CVD method, dry plating methods such as vacuum deposition and sputtering, or the like.

6. Next, the blue light emitting layer 63 is formed on the intermediate layer 62. It is possible to form the blue light emitting layer 63, for example, by a vapor phase process which uses a CVD method, dry plating methods such as vacuum deposition and sputtering, or the like.

7. Next, the green light emitting layer 64 is formed on the blue light emitting layer 63. It is possible to form the green light emitting layer 64, for example, by a vapor phase process which uses a CVD method, dry plating methods such as vacuum deposition and sputtering, or the like.

8. Next, the electron transportation layer 7 is formed on the green light emitting layer 64. It is possible to form the electron transportation layer 7, for example, by a vapor phase process which uses a CVD method, dry plating methods such as vacuum deposition and sputtering, or the like.

In addition, it is also possible to form the electron transportation layer 7, for example, by carrying out drying (removing the solvent or dispersion medium) after supplying a material for forming an electron transportation layer formed by dissolving an electron transportation material in a solvent or dispersing an electron transportation material in a dispersion medium on the green light emitting layer 64.

9. Next, the electron injection layer 8 is formed on the electron transportation layer 7. In a case of using an inorganic material as a constituent material of the electron injection layer 8, it is possible to form the electron injection layer 8, for example, using a vapor phase process which uses a CVD method, a dry plating method such as vacuum deposition and sputtering, or the like, coating and firing of ink with inorganic fine particles, and the like.

10. Next, the cathode 9 is formed on the electron injection layer 8. It is possible to form the cathode 9, for example, using a vacuum vapor deposition method, a sputtering method, metallic foil bonding, coating and firing of ink with metal fine particles, and the like.

The light emitting element 1 is obtained through the processes described above. Finally, the sealing member 10 is overlaid so as to cover the obtained light emitting element 1 and is bonded with the substrate 2.

Second Embodiment

Figure 2:
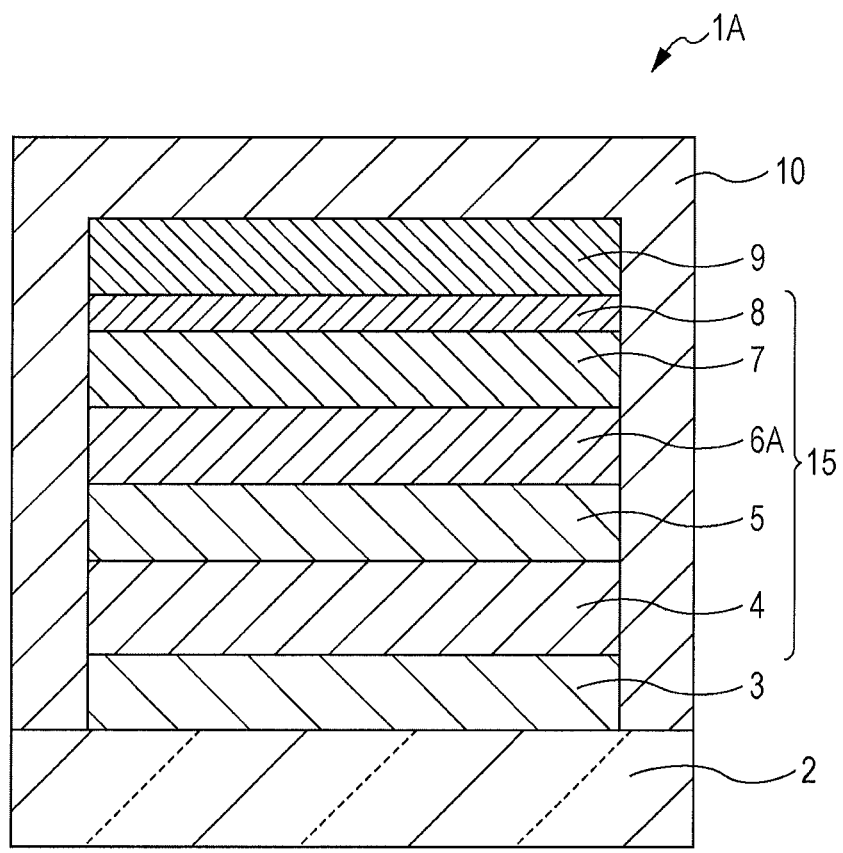
FIG. 2 is a diagram which schematically shows a longitudinal section of a light emitting element according to a second embodiment of the invention.

FIG. 2 is a diagram which schematically shows a longitudinal section of a light emitting element according to a second embodiment of the invention. Here, below, for convenience of description, description will be performed by referring to the upper side, that is, the cathode 9 side, as "above" and referring to the lower side, that is, the anode 3 side, as "below" in FIG. 2.

A light emitting element 1A according to the present embodiment is the same as the light emitting element 1 of the first embodiment described above except that a light emitting section 6A is one light emitting layer.

In the light emitting element 1A with this configuration, the light emitting section 6A is configured to include a light emitting material, a host material which holds the light emitting material, and an assist dopant material which has opposite mobility with respect to the host material and satisfies a relationship of $0.01 \leq \mu e/\mu h \leq 100$ in the light emitting section (the light emitting layer) 6A.

In addition, it is preferable that the light emitting section 6A satisfies the relational formula (A).

The light emitting materials which are able to be used for the light emitting section 6A are not particularly limited and it is possible to appropriately use one type of the red light emitting material, the blue light emitting material, the green light emitting material, and the like described above or to combine two types or more.

In addition, as the host material and the assist dopant material which are included in the light emitting section 6A, it is possible to use each of the materials in the first embodiment described above. It is possible to obtain the same effects as the first embodiment of the invention with the configuration described above.

It is possible to use the light emitting elements 1 and 1A described above, for example, in a light emitting device (the light emitting device of the invention).

Since the light emitting device is provided with the light emitting elements 1 and 1A described above, driving is possible at a comparatively low voltage.

In addition, it is possible to use such a light emitting device, for example, as a light source or the like used for illumination or the like.

In addition, it is possible to configure a light emitting device which is used for a display apparatus by arranging a plurality of the light emitting elements 1 in the light emitting device in a matrix form.

Figure 3:
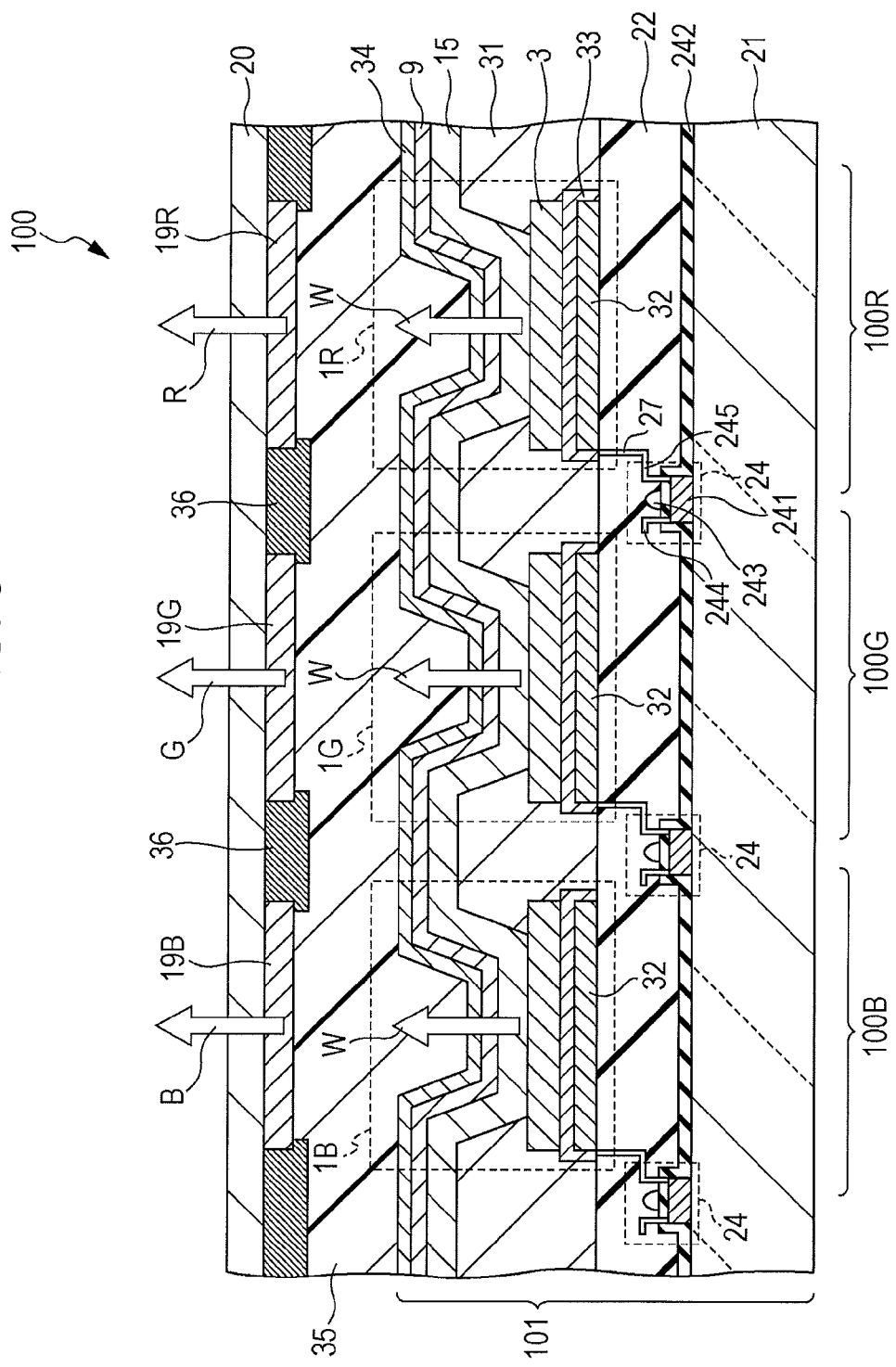
FIG. 3 is a longitudinal sectional diagram which shows an embodiment of a display apparatus to which a display apparatus according to an aspect of the invention is applied.

Next, description will be given of one example of a display apparatus to which a display apparatus according to an aspect of the invention is applied. FIG. 3 is a longitudinal sectional diagram which shows an embodiment of a display apparatus to which a display apparatus according to an aspect of the invention is applied.

A display apparatus 100 shown in FIG. 3 has a light emitting device 101, which is provided with a plurality of light emitting elements 1R, 1G, and 1B provided in correspondence with sub pixels 100R, 100G, and 100B, and has color filters 19R, 19G, and 19B. Here, the display apparatus 100 is a display panel with a top emission structure. Here, the method for driving the display apparatus is not particularly limited and may be either an active matrix method or a passive matrix method.

The light emitting device 101 has a substrate 21, the light emitting elements 1R, 1G, and 1B, and a driving transistor 24.

A plurality of the driving transistors 24 are provided on the substrate 21. A planarizing layer 22 which is configured by an insulation material is formed so as to cover these driving transistors 24.

Each of the driving transistors 24 has a semiconductor layer 241 formed of silicon, a gate insulation layer 242 which is formed on the semiconductor layer 241, a gate electrode 243 which is formed on the gate insulation layer 242, a source electrode 244, and a drain electrode 245.

The light emitting elements 1R, 1G, and 1B are provided on the planarizing layer 22 in correspondence with each of the driving transistors 24.

With regard to the light emitting element 1R, a reflecting film 32, a corrosion prevention film 33, the anode 3, the laminated body 15, the cathode 9, and a cathode cover 34 are laminated on the planarizing layer 22 in this order. In the present embodiment, the anode 3 of each of the light emitting elements 1R, 1G, and 1B configures a pixel electrode. The anode 3 is electrically connected with the drain electrode 245 of each of the driving transistors 24 via a conductive section (wiring) 27. In addition, the cathode 9 of each of the light emitting elements 1R, 1G, and 1B is a common electrode.

Here, the configuration of the light emitting elements 1G and 1B is the same as the configuration of the light emitting element 1R. In addition, in FIG. 3, the same reference numerals are given with regard to the same configuration as FIG. 1. In addition, the configuration (characteristics) of the reflecting film 32 may be different among the light emitting elements 1R, 1G, and 1B according to the wavelengths of light. Partition walls 31 are provided between each of adjacent light emitting elements 1R, 1G, and 1B.

In addition, an epoxy layer 35 which is configured by an epoxy resin is formed so as to cover the light emitting device 101 which is configured in this manner.

The color filters 19R, 19G, and 19B are provided on the epoxy layer 35 described above in correspondence with the light emitting elements 1R, 1G, and 1B.

The color filter 19R converts white light W from the light emitting element 1R into a red color. In addition, the color filter 19G converts white light W from the light emitting element 1G into a green color. In addition, the color filter 19B converts white light W from the light emitting element 1B into a blue color. By using such color filters 19R, 19G, and 19B in combination with the light emitting elements 1R, 1G, and 1B, it is possible to display a full color image.

In addition, a light shielding layer 36 is formed between each adjacent color filters 19R, 19G, and 19B. Due to this, it is possible to prevent the sub pixels 100R, 100G, and 100B from emitting light unintentionally.

Then, a sealing substrate 20 is provided so as to cover the color filter 19R, 19G, and 19B and the light shielding layer 36.

The display apparatus 100 described above may be a single color display and may be a color display by selecting the light emitting material which is used for each of the light emitting elements 1R, 1G, and 1B.

Since the display apparatus 100 (the display apparatus of the invention) uses the light emitting device 101 described above, driving is possible at a comparatively low voltage. For this reason, it is possible to display an image with high quality with low electricity consumption.

Figure 4:
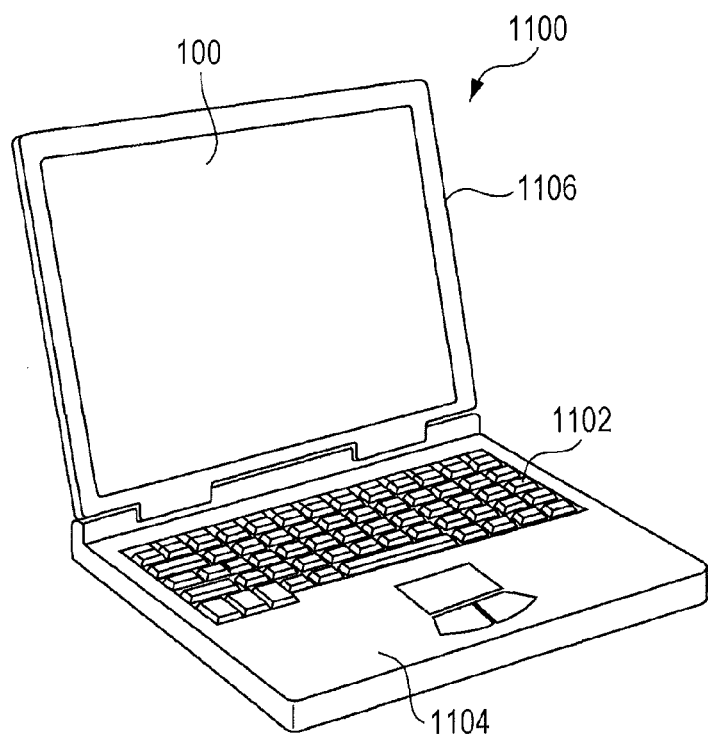
FIG. 4 is a perspective diagram which shows a configuration of a mobile type (alternatively, a notebook type) personal computer to which electronic equipment according to an aspect of the invention is applied.

FIG. 4 is a perspective diagram which shows a configuration of a mobile type (alternatively, a notebook type) personal computer to which the electronic equipment according to an aspect of the invention is applied.

In the diagram, a personal computer 1100 is configured by a main body section 1104 which is provided with a keyboard 1102 and a display unit 1106 which is provided with a display section. The display unit 1106 is supported so as to be able to rotate with respect to the main body section 1104 via a hinge structure section.

In the personal computer 1100, the display section with which the display unit 1106 is provided is configured by the display apparatus 100 described above.

Figure 5:
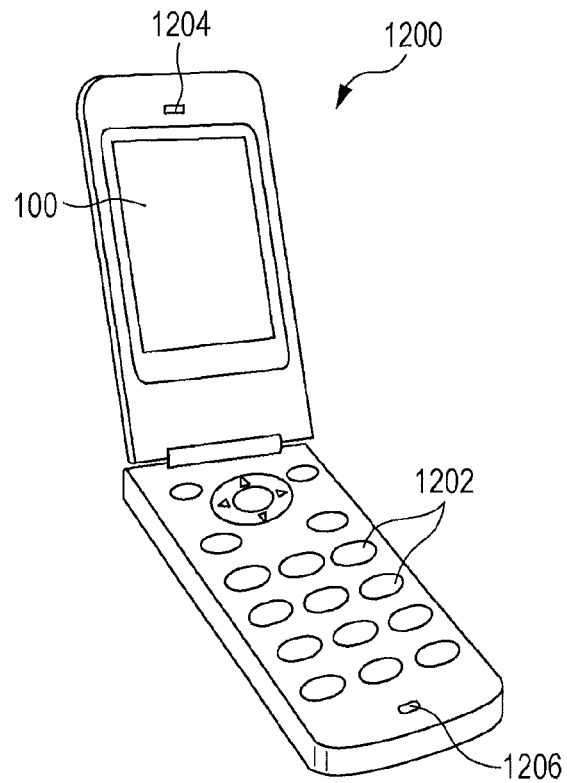
FIG. 5 is a perspective diagram which shows a configuration of a mobile phone (which includes a PHS) to which the electronic equipment according to an aspect of the invention is applied.

FIG. 5 is a perspective diagram which shows a configuration of a mobile phone (which includes a PHS) to which the electronic equipment according to an aspect of the invention is applied.

In the diagram, a mobile phone 1200 is provided with a plurality of operation buttons 1202, an earpiece 1204, a mouthpiece 1206, and a display section.

In the mobile phone 1200, a display section is configured by the display apparatus 100 described above.

Figure 6:
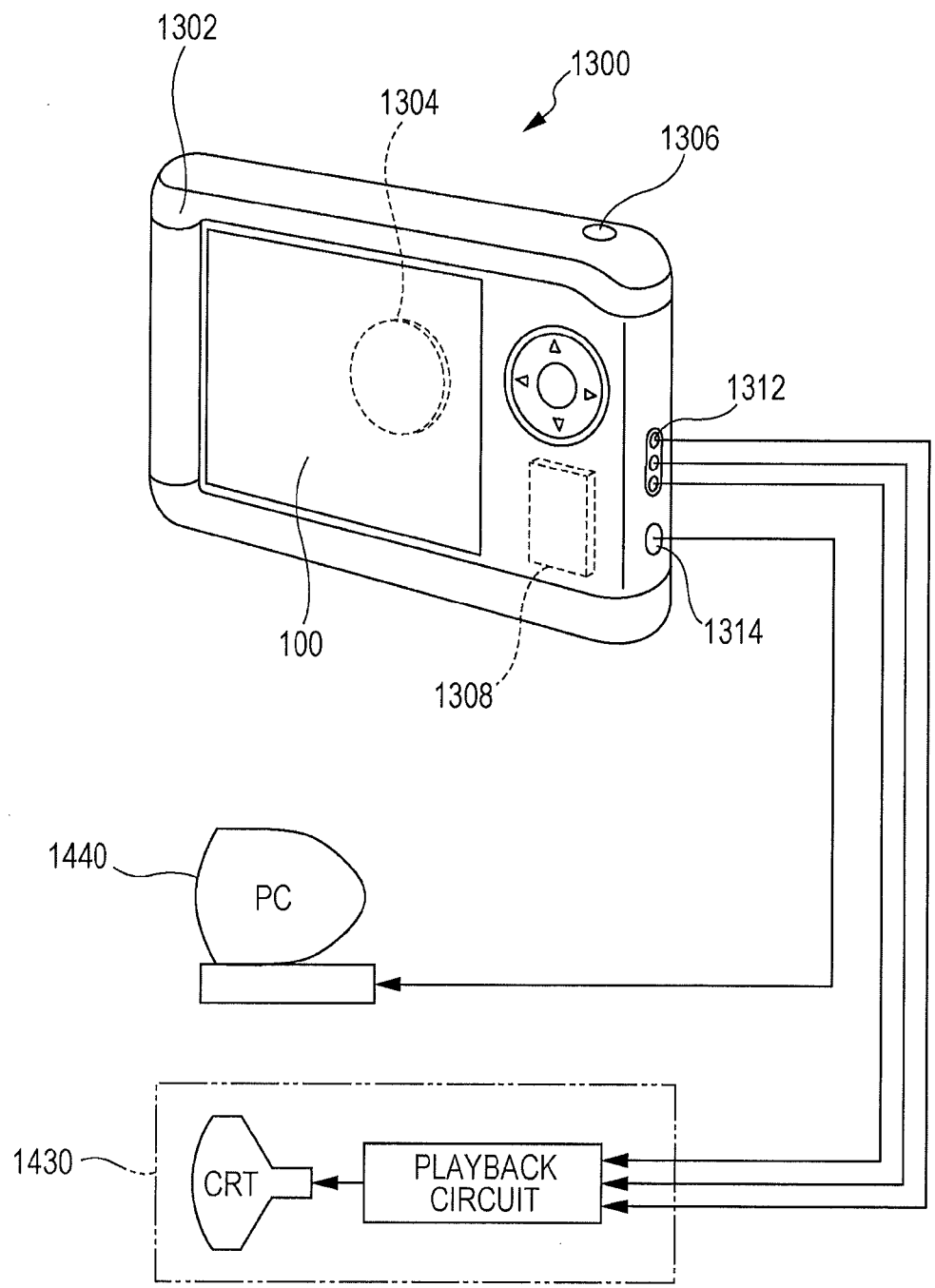
FIG. 6 is a perspective diagram which shows a configuration of a digital still camera to which the electronic equipment according to an aspect of the invention is applied.

FIG. 6 is a perspective diagram which shows a configuration of a digital still camera to which the electronic equipment according to an aspect of the invention is applied. Here, a connection with an external device is also briefly shown in the diagram.

A digital still camera 1300 is provided with a case (a body) 1302, a light receiving unit 1304, a shutter button 1306, a circuit substrate 1308, a video signal output terminal 1312, a data communication input-output terminal 1314, and a display section.

Here, a normal camera exposes a silversalt photograph film to light according to a light image of a subject. In contrast, the digital still camera 1300 photoelectrically converts a light image of a subject using an imaging element such as a charged coupled device (CCD) to generate an imaging signal (an image signal).

A display section is provided on a rear surface of the case (body) 1302 in the digital still camera 1300. The display section is configured to perform a display based on the imaging signal from a CCD and functions as a finder which displays a subject as an electronic image.

In the digital still camera 1300, the display section is configured by the display apparatus 100 described above.

The circuit substrate 1308 is installed inside the case. A memory which is able to store (record) imaging signals is installed in the circuit substrate 1308.

In addition, the light receiving unit 1304 which includes an optical lens (an imaging optical system), a CCD, and the like is provided on a front surface side (a rear surface side in the configuration shown in the diagram) of the case 1302.

When the person doing the imaging presses the shutter button 1306 after confirming the subject image which is displayed on a display section, the imaging signal of the CCD at that time is transferred and stored in the memory of the circuit substrate 1308.

In addition, the digital still camera 1300 is provided with the video signal output terminal 1312 and the data communication input-output terminal 1314 on a side surface of the case 1302. As shown in the diagram, a television monitor 1430 is connected with the video signal output terminal 1312 as necessary. In addition, a personal computer 1440 is connected with the data communication input-output terminal 1314 as necessary. Due to this, when a predetermined operation is carried out, imaging signals which are stored in the memory of the circuit substrate 1308 are output to the television monitor 1430 or the personal computer 1440.

Here, electronic equipment according to an aspect of the invention is not limited to the personal computer (a mobile type personal computer) in FIG. 4, the mobile phone in FIG. 5, and the digital still camera in FIG. 6. Examples of electronic equipment according to an aspect of the invention include televisions, video cameras, view finder type or monitor direct-view type video tape recorders, laptop type personal computers, car navigation apparatuses, pagers, electronic notebooks (including electronic notebooks with communication functions), electronic dictionaries, calculators, electronic game devices, word processors, work stations, videophones, television monitors for security, electronic binoculars, POS terminals, devices provided with a touch panel (for example, cash dispensers at financial institutions and automatic ticket vending machines), medical devices (for example, electronic thermometers, sphygmomanometers, blood sugar meters, heart electric display apparatuses, ultrasonic diagnostic apparatuses, and display apparatuses for endoscope), fish finders, various types of measuring devices, meters (for example, meters for vehicles, airplanes, and ships), flight simulators, various other types of monitors, and projection type display apparatuses such as projectors.

Above, description was given of a light emitting element, a light emitting device, a display apparatus and electronic equipment according to an aspect of the invention based on the embodiments shown in the diagrams; however, the invention is not limited thereto.

For example, in the embodiments described above, description was given of a case where a blue light emitting layer and a green light emitting layer with which a light emitting element is provided are configured to include a light emitting material, a host material, and an assist dopant material to satisfy the relational formula (I). However, the invention is not limited to this case and, for example, a red light emitting layer with which a light emitting element is provided may be configured to include a light emitting material, a host material, and an assist dopant material to satisfy the relational formula (I) and at least one of a blue light emitting layer and a green light emitting layer may be configured to include a light emitting material, a host material, and an assist dopant material to satisfy the relational formula (I).

In addition, in the embodiments described above, description was given with the light emitting element having one or three light emitting layers; however, there may be two or four or more light emitting layers. In such a case, at least one light emitting layer with which a light emitting element is provided may be configured to include a light emitting material, a host material, and an assist dopant material to satisfy the relational formula (I).

Furthermore, in the first embodiment, description was given with a light emitting element having three light emitting layers which emit each of red, blue, and green light, that is, a plurality of light emitting layers which emit light of different colors; however, it is also possible to apply a light emitting element according to an aspect of the invention to a light emitting element which has a plurality of light emitting layers which emit light of the same color.

EXAMPLES

Next, description will be given of specific examples of the invention.

1. Manufacturing Light Emitting Element

Example 1A

1. Firstly, a transparent glass substrate with an average thickness of 0.5 mm was prepared. Next, an ITO electrode (an anode) with an average thickness of 50 nm was formed on the substrate by a sputtering method.

Then, oxygen plasma processing was carried out after carrying out ultrasonic cleaning by dipping the substrate in acetone and 2-propanol in this order.

2. Next, a hole transportation layer with an average thickness of 40 nm was formed on an ITO electrode by depositing N,N'-di(1-naphthyl)-N,N'-diphenyl[1,1'-biphenyl]-4,4'diamine (α-NPD) shown in formula (2) by a vacuum vapor deposition method.

3. Next, a red light emitting layer (a first light emitting layer) with an average thickness of 5 nm was formed on the hole transportation layer by depositing a constituent material of a red light emitting layer by a vacuum vapor deposition method. As the constituent material of the red light emitting layer, a tetraaryl diindeno perylene derivative shown in formula (5) was used as the red light emitting material (a first light emitting material) which was a guest material. In addition, a naphthacene derivative shown in formula (7) was used as a host material (a first host material). Here, the content (doping concentration) of the first light emitting material (dopant) in the red light emitting layer was 1.5 wt %.

4. Next, an intermediate layer with an average thickness of 20 nm was formed on the red light emitting layer by depositing a constituent material of the intermediate layer by a vacuum vapor deposition method. A mixture in which the anthracene derivative shown in formula (6) and a compound represented by formula (4) are mixed 50:50 was used as a constituent material of the intermediate layer.

5. Next, a blue light emitting layer (a second light emitting layer) with an average thickness of 15 nm was formed on the intermediate layer by depositing a constituent material of the blue light emitting layer by a vacuum vapor deposition method. As a constituent material of the blue light emitting layer, a distyryl amine-based compound shown by formula (8) was used as a blue light emitting material (a second light emitting material) which was a guest material. In addition, the anthracene derivative shown in formula (6) was used as a host material (a second host material). In addition, an amine derivative represented by formula (4) was used as an assist dopant material (a second assist dopant material). Here, the content (doping concentration) of the blue light emitting material (a dopant) in the blue light emitting layer was 8.0 wt %. In addition, a mixing ratio of the anthracene derivative shown in formula (6) and an amine derivative represented by formula (4) was 80:20.

6. Next, a green light emitting layer (a third light emitting layer) with an average thickness of 15 nm was formed on the blue light emitting layer by depositing a constituent material of the blue light emitting layer by a vacuum vapor deposition method. As a constituent material of the green light emitting layer, a quinacridone derivative shown in formula (9) was used as a green light emitting material (a third light emitting material) which was a guest material. In addition, the anthracene derivative shown in formula (6) was used as a host material (a third host material). In addition, an amine derivative represented by formula (4) was used as an assist dopant material (a third assist dopant material). Here, the content (doping concentration) of the green light emitting material (a dopant) in the green light emitting layer was 1.0 wt %. In addition, a mixing ratio of the anthracene derivative shown in formula (6) and an amine derivative represented by formula (4) was 80:20.

7. Next, an electron transportation layer with an average thickness of 25 nm was formed on the green light emitting layer by film-forming an azaindolizine derivative shown in formula (11) by a vacuum vapor deposition method.

8. Next, an electron injection layer with an average thickness of 1 nm was formed on the electron transportation layer by film-forming lithium fluoride (LiF) by a vacuum vapor deposition method.

9. Next, Al was film-formed on the electron injection layer by a vacuum vapor deposition method. Due to this, a cathode with an average thickness of 100 nm and configured by Al was formed.

10. Next, a protective cover (a sealing member) made of glass was overlaid so as to cover each formed layer (laminated body) and fixed and sealed by an epoxy resin. Due to the processes above, a light emitting element of example 1A as shown in FIG. 1 which emits white light was manufactured.

Examples 2A to 4A and Comparative Example 2A

Light emitting elements of the examples 2A to 4A and comparative example 2A were manufactured in the same manner as example 1A except that the mixing ratio of the anthracene derivative shown in formula (6) and the amine derivative presented by formula (4) in the blue light emitting layer and the green light emitting layer was changed as shown in Table 1.

Comparative Example 1A

A light emitting element of the comparative example 1A was manufactured in the same manner as example 1A except that the addition of an amine derivative represented by formula (4) in the blue light emitting layer and the green light emitting layer was omitted.

TABLE 1

| | | HTL | EML | INTER-MEDIATE LAYER | | EML1 (Blue) | | | EML2 (Green) | | | FILM THICKNESS: nm | | |
|---|---|---|---|---|---|---|---|---|---|---|---|---|---|---|
| | | | | | | | | | | | | ETL | EIL | Cathode |
| EXAMPLE 1A | MATERIAL CONCENTRATION | HTL-1 | Host-2 | RD 1.5 wt % | | Host 1 50:50 | AD-1 | Host-1 80:20 | AD-1 | BD 8 wt % | Host-1 80:20 | AD-1 | GD 1 wt % | ETL-1 | LiF | Al |
| | FILM THICKNESS | 40 | 5 | 20 | | 15 | | | 15 | | | 25 | 1 | 100 |
| EXAMPLE 2A | MATERIAL CONCENTRATION | HTL-1 | Host-2 | RD 1.5 wt % | | Host 1 50:50 | AD-1 | Host-1 70:30 | AD-1 | BD 8 wt % | Host-1 70:30 | AD-1 | GD 1 wt % | ETL-1 | LiF | Al |
| | FILM THICKNESS | 40 | 5 | 20 | | 15 | | | 15 | | | 25 | 1 | 100 |
| EXAMPLE 3A | MATERIAL CONCENTRATION | HTL-1 | Host-2 | RD 1.5 wt % | | Host 1 50:50 | AD-1 | Host-1 50:50 | AD-1 | BD 8 wt % | Host-1 50:50 | AD-1 | GD 1 wt % | ETL-1 | LiF | Al |
| | FILM THICKNESS | 40 | 5 | 20 | | 15 | | | 15 | | | 25 | 1 | 100 |
| EXAMPLE 4A | MATERIAL CONCENTRATION | HTL-1 | Host-2 | RD 1.5 wt % | | Host 1 50:50 | AD-1 | Host-1 60:40 | AD-1 | BD 8 wt % | Host-1 60:40 | AD-1 | GD 1 wt % | ETL-1 | LiF | Al |
| | FILM THICKNESS | 40 | 5 | 20 | | 15 | | | 15 | | | 25 | 1 | 100 |

TABLE 1-continued

| | | HTL | EML | INTERMEDIATE LAYER | EML1 (Blue) | EML2 (Green) | ETL | EIL | Cathode |
|---|---|---|---|---|---|---|---|---|---|
| | | | | | | | | | FILM THICKNESS: nm |
| COMPARATIVE EXAMPLE 1A | MATERIAL CONCENTRATION | HTL-1 | Host-2 | Host 1 / AD-1 50:50 / RD 1.5 wt% | Host-1 / — / BD 8 wt% | Host-1 / — / GD 1 wt% | ETL-1 | LiF | Al |
| | FILM THICKNESS | 40 | 5 | 20 | 15 | 15 | 25 | 1 | 100 |
| COMPARATIVE EXAMPLE 2A | MATERIAL CONCENTRATION | HTL-1 | Host-2 | Host 1 / AD-1 50:50 / RD 1.5 wt% | Host-1 / AD-1 90:10 / BD 8 wt% | Host-1 / AD-1 90:10 / GD 1 wt% | ETL-1 | LiF | Al |
| | FILM THICKNESS | 40 | 5 | 20 | 15 | 15 | 25 | 1 | 100 |

2. Evaluation

2-1. Evaluation of Mobility Ratio μe/μh

With regard to light emitting elements of the examples 1A to 4A and the comparative examples 1A and 2A, the hole mobility and the electron mobility of the blue light emitting layer were obtained by impedance spectroscopy and the ratio of these mobilities was obtained. Due to this, a mobility ratio μe/μh was obtained.

2-2. Evaluation of Light Emitting Life Span

The light emitting element of the comparative example 1A emitted light using direct current power and the initial brightness was constant. After that, the brightness was measured using a brightness photometer and the time until the brightness became 80% of the initial brightness (LT80) was measured. With regard to the light emitting elements of the examples 1A to 4A and comparative example 2A, a relative value was obtained when the LT 80 which was measured in the light emitting element of the comparative example 1A was set to 100. The evaluation results described above are shown in Table 2.

TABLE 2

| | * MOBILITY RATIO IS VALUE OF B-EML | |
|---|---|---|
| | MOBILITY RATIO (μe/μh) | LIFESPAN LT80 |
| EXAMPLE 1A | 50 | 160 |
| EXAMPLE 2A | 6 | 180 |
| EXAMPLE 3A | 0.1 | 130 |
| EXAMPLE 4A | 0.013 | 120 |
| COMPARATIVE EXAMPLE 1A | >7000 | 100 |
| COMPARATIVE EXAMPLE 2A | 600 | 110 |

As is clear from Table 2, the size of the mobility ratio μe/μh of the light emitting elements of the examples 1A to 4A was within a range of 0.01 or more to 100 or less and the light emitting life span was long compared to the comparative examples 1A and 2A where the size of the mobility ratio μe/μh was not within a range of 0.01 or more to 100 or less.

Here, the HOMO level, the LUMO level, the mobility of holes, and the mobility of electrons of the anthracene derivative shown in formula (6) which were used in the processes 5 and 6 were respectively 5.9 [eV], 2.9 [eV], less than $1.0 \times 10^{-9}$ [cm$^2$/Vs], and $7.0 \times 10^{-6}$ [cm$^2$/V]. In addition, a HOMO level, a LUMO level, the mobility of holes, and the mobility of electrons of the amine derivative represented by formula (4) were respectively 5.6 [eV], 2.5 [eV], $9.0 \times 10^{-4}$ [cm$^2$/Vs], and less than $1.0 \times 10^{-9}$ [cm$^2$/V].

Here, the HOMO level, the LUMO level, the mobility of holes, and the mobility of electrons of the anthracene derivative and the amine derivative were respectively measured by impedance spectroscopy.

3. Manufacturing Light Emitting Element

Example 1B

1. Firstly, a transparent glass substrate with an average thickness of 0.5 mm was prepared. Next, an ITO electrode (an anode) with an average thickness of 50 nm was formed on the substrate by a sputtering method.

Then, oxygen plasma processing was carried out after carrying out ultrasonic cleaning by dipping the substrate in acetone and 2-propanol in this order.

2. Next, a hole transportation layer with an average thickness of 60 nm was formed on an ITO electrode by depositing N,N'-di(1-naphthyl)-N,N'-diphenyl[1,1'-biphenyl]-4,4'diamine (α-NPD) shown in formula (2) by a vacuum vapor deposition method.

3. Next, a blue light emitting layer (a light emitting section) with an average thickness of 40 nm was formed on the hole transportation layer by depositing a constituent material of the blue light emitting layer by a vacuum vapor deposition method. As a constituent material of the blue light emitting layer, the distyryl amine-based compound shown in formula (8) was used as the blue light emitting material. In addition, the anthracene derivative shown in formula (6) was used as a host material. In addition, an amine derivative represented by formula (4) was used as an assist dopant material. Here, the content (doping concentration) of the blue light emitting material (a dopant) in the blue light emitting layer was 8.0 wt %. In addition, the mixing ratio of the anthracene derivative shown in formula (6) and the amine derivative represented by formula (4) was 80:20.

4. Next, an electron transportation layer with an average thickness of 20 nm was formed on the light emitting layer by film-forming an azaindolizine derivative shown in formula (11) by a vacuum vapor deposition method.

5. Next, an electron injection layer with an average thickness of 1 nm was formed on the electron transportation layer by film-forming lithium fluoride (LiF) by a vacuum vapor deposition method.

6. Next, Al was film-formed on the electron injection layer by a vacuum vapor deposition method. Due to this, a cathode with an average thickness of 100 nm and configured by Al was formed.

7. Next, a protective cover (a sealing member) made of glass was overlaid so as to cover each formed layer and fixed and sealed by an epoxy resin. Due to the processes above, a light emitting element of example 1B as shown in FIG. 2 which emits blue light was manufactured.

Examples 2B to 4B and Comparative Example 2B

Light emitting elements of the examples 2B to 4B and comparative example 2B were manufactured in the same manner as example 1B except that the mixing ratio of the anthracene derivative shown in formula (6) and the amine derivative presented by formula (4) in the light emitting layer was changed as shown in Table 3.

Comparative Example 1B

A light emitting element of the comparative example 1B was manufactured in the same manner as example 1B except that the addition of an amine derivative represented by formula (4) in the blue light emitting layer and the green light emitting layer was omitted.

was measured. With regard to the light emitting elements of examples 1B to 4B and comparative example 2B, a relative value was obtained when the LT 80 which was measured in the light emitting element of the comparative example 1B was set to 100. The evaluation results described above are shown in Table 4.

TABLE 4

|  | MOBILITY RATIO ($\mu e/\mu h$) | LIFESPAN LT80 |
| --- | --- | --- |
| EXAMPLE 1B | 50 | 170 |
| EXAMPLE 2B | 6 | 200 |
| EXAMPLE 3B | 0.1 | 150 |
| EXAMPLE 4B | 0.013 | 120 |
| COMPARATIVE EXAMPLE 1B | >7000 | 100 |
| COMPARATIVE EXAMPLE 2B | 600 | 110 |

As is clear from Table 4, the size of the mobility ratio $\mu e/\mu h$ of the light emitting elements of examples 1B to 4B is within a range of 0.01 or more to 100 or less and the light emitting life span was long compared to the comparative examples 1B and 2B where the size of a mobility ratio $\mu e/\mu h$ was not within a range of 0.01 or more to 100 or less.

The entire disclosure of Japanese Patent Application No. 2014-078249, filed Apr. 4, 2014 and 2014-078250, filed Apr. 4, 2014 are expressly incorporated by reference herein.

TABLE 3

|  |  | HTL | B-EML | | | ETL | EIL | Cathode |
| --- | --- | --- | --- | --- | --- | --- | --- | --- |
| | | | | | FILM THICKNESS: nm | | | |
| EXAMPLE 1B | MATERIAL CONCENTRATION FILM THICKNESS | HTL-1 60 | Host-1 80:20 40 | AD-1 | BD 8 wt % | ETL-1 20 | LiF 1 | Al 100 |
| EXAMPLE 2B | MATERIAL CONCENTRATION FILM THICKNESS | HTL-1 60 | Host-1 70:30 40 | AD-1 | BD 8 wt % | ETL-1 20 | LiF 1 | Al 100 |
| EXAMPLE 3B | MATERIAL CONCENTRATION FILM THICKNESS | HTL-1 60 | Host-1 50:50 40 | AD-1 | BD 8 wt % | ETL-1 20 | LiF 1 | Al 100 |
| EXAMPLE 4B | MATERIAL CONCENTRATION FILM THICKNESS | HTL-1 60 | Host-1 60:40 40 | AD-1 | BD 8 wt % | ETL-1 20 | LiF 1 | Al 100 |
| COMPARATIVE EXAMPLE 1B | MATERIAL CONCENTRATION FILM THICKNESS | HTL-1 60 | Host-1 40 | — | BD 8 wt % | ETL-1 20 | LiF 1 | Al 100 |
| COMPARATIVE EXAMPLE 2B | MATERIAL CONCENTRATION FILM THICKNESS | HTL-1 60 | Host-1 90:10 40 | AD-1 | BD 8 wt % | ETL-1 20 | LiF 1 | Al 100 |

4. Evaluation 4-1. Evaluation of Mobility Ratio $\mu e/\mu h$

With regard to the light emitting elements of examples 1B to 4B and comparative examples 1B and 2B, the hole mobility and the electron mobility of the light emitting layer were obtained by impedance spectroscopy and the ratio of these mobilities was obtained. Due to this, the mobility ratio $\mu e/\mu h$ was obtained.

4-2. Evaluation of Light Emitting Life Span

The light emitting element of comparative example 1B emitted light using direct current power and the initial brightness was constant. After that, the brightness was measured using a brightness photometer and the time until the brightness became 80% of the initial brightness (LT80)

What is claimed is:

1. A light emitting element comprising:
 a cathode;
 an anode; and
 a light emitting layer which is provided between the cathode and the anode and emits light by a driving voltage being applied thereto,
 wherein the light emitting layer includes a light emitting material, a host material, and an assist dopant material,
 one of the host material and the assist dopant material is a material with a substantially higher electron transportation property than a hole transportation property,
 the other is a material with a substantially higher hole transportation property than an electron transportation property, when a mobility of holes is μh and a mobility of electrons is μe in the light emitting layer, a mobility ratio which is represented by μe/μh satisfies a relationship of formula (I) below $0.01 \leq \mu e/\mu h \leq 100$ (I), and wherein relational formula (A) below is satisfied when a HOMO level, a LUMO level, a mobility of holes, and a mobility of electrons in the host material are respectively $HOMO_{Host}$, $LUMO_{Host}$, $\mu h_{Host}$, and $\mu e_{Host}$, and a HOMO level, a LUMO level, a mobility of holes, and a mobility of electrons in the assist dopant material are respectively $HOMO_{Assist}$, $LUMO_{Assist}$, $\mu h_{Assist}$, and $\mu e_{Assist}$, $HOMO_{Assist} + 0.2\ eV < HOMO_{Host}$ $LUMO_{Host} > LUMO_{Assist} + 0.2\ eV$ $\mu h_{Host} < \mu h_{Assist}$ $\mu e_{Host} > \mu e_{Assist}$ (A).

2. The light emitting element according to claim 1, wherein content of the assist dopant material is 20 wt % or more to 70 wt % or less in the light emitting layer.

3. The light emitting element according to claim 1, wherein the host material is a material with a high electron transportation property, and the assist dopant material is a material with a high hole transportation property.

4. The light emitting element according to claim 1, wherein the host material is an acene-based compound.

5. The light emitting element according to claim 4, wherein the assist dopant material is an amine-based compound.

6. The light emitting element according to claim 5, wherein the amine-based compound is a compound which is shown by formula (4) below

[Chem. 1]

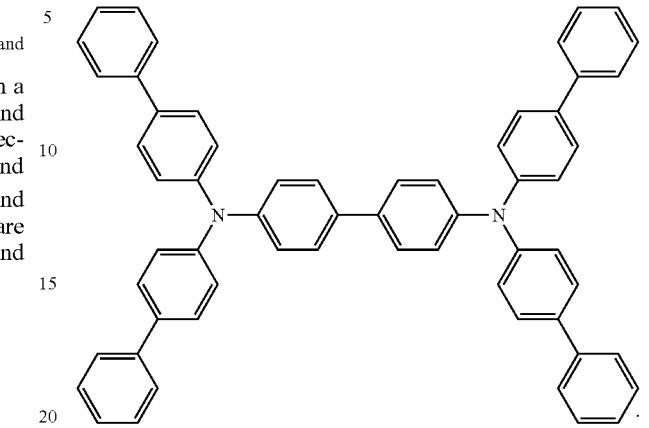

(4)

7. A light emitting device comprising:
the light emitting element according to claim 1.
8. A light emitting device comprising:
the light emitting element according to claim 2.
9. A light emitting device comprising:
the light emitting element according to claim 3.
10. A light emitting device comprising:
the light emitting element according to claim 4.
11. A light emitting device comprising:
the light emitting element according to claim 5.
12. A light emitting device comprising:
the light emitting element according to claim 6.
13. A display apparatus comprising:
the light emitting device according to claim 7.
14. A display apparatus comprising:
the light emitting device according to claim 8.
15. A display apparatus comprising:
the light emitting device according to claim 9.
16. A display apparatus comprising:
the light emitting device according to claim 10.
17. Electronic equipment comprising:
the display apparatus according to claim 13.

* * * * *